(12) United States Patent
Niwa et al.

(10) Patent No.: US 11,895,411 B2
(45) Date of Patent: Feb. 6, 2024

(54) IMAGING DEVICE WITH EXTENDED EVENT SIGNAL DETECTION TIMING

(71) Applicant: SONY SEMICONDUCTOR SOLUTIONS CORPORATION, Kanagawa (JP)

(72) Inventors: Atsumi Niwa, Kanagawa (JP); Yusuke Oike, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/753,713

(22) PCT Filed: Jul. 14, 2020

(86) PCT No.: PCT/JP2020/027361
§ 371 (c)(1),
(2) Date: Mar. 11, 2022

(87) PCT Pub. No.: WO2021/053946
PCT Pub. Date: Mar. 25, 2021

(65) Prior Publication Data
US 2022/0345645 A1   Oct. 27, 2022

(30) Foreign Application Priority Data
Sep. 20, 2019   (JP) .................. 2019-171452

(51) Int. Cl.
*H04N 25/40*   (2023.01)
*H04N 25/77*   (2023.01)
(Continued)

(52) U.S. Cl.
CPC ............ *H04N 25/40* (2023.01); *H04N 25/77* (2023.01)

(58) Field of Classification Search
CPC ...... H04N 25/40; H04N 25/77; H04N 25/707; H04N 25/702; H04N 25/703; H04N 25/47;
(Continued)

(56) References Cited

U.S. PATENT DOCUMENTS 11,153,519 B2 * 10/2021 Niwa ..................... H04N 25/77
2016/0241795 A1   8/2016 Nishihara
(Continued)

FOREIGN PATENT DOCUMENTS

CN   105659585 A   6/2016
CN   110169050 A   8/2019
(Continued)

OTHER PUBLICATIONS

International Search Report and Written Opinion of PCT Application No. PCT/JP2020/027361, dated Oct. 13, 2020, 09 pages of ISRWO.

*Primary Examiner* — Marly S Camargo
(74) *Attorney, Agent, or Firm* — CHIP LAW GROUP

(57) ABSTRACT

It is an object to extend event signal detection periods. An imaging device according to the present technology includes a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result, and a control unit that performs control so that different pixels have different timing for an event detection period to cause the detection circuit to execute the event signal detection.

11 Claims, 21 Drawing Sheets

(51) Int. Cl.
*H04N 25/702* (2023.01)
*H04N 25/703* (2023.01)
*H04N 25/707* (2023.01)
*H04N 25/47* (2023.01)
*H01L 31/107* (2006.01)
*H01L 29/66* (2006.01)
*H01L 29/06* (2006.01)

(58) Field of Classification Search
CPC ............ H01L 29/0626; H01L 29/6613; H01L 29/7313; H01L 31/107
See application file for complete search history.

(56) References Cited

U.S. PATENT DOCUMENTS

| | | | |
|---|---|---|---|
| 2018/0189959 A1 | 7/2018 | Berner et al. | |
| 2022/0030190 A1* | 1/2022 | Hizu | H04N 25/771 |
| 2022/0159201 A1* | 5/2022 | Kitano | H04N 25/771 |
| 2022/0166925 A1* | 5/2022 | Nakagawa | H04N 23/61 |
| 2022/0375256 A1* | 11/2022 | Endo | H04N 25/611 |

FOREIGN PATENT DOCUMENTS

| | | | |
|---|---|---|---|
| JP | 2015-076773 A | 4/2015 | |
| JP | 2020-503752 A | 1/2020 | |
| KR | 10-2016-0067848 A | 6/2016 | |
| KR | 10-2019-0102021 A | 9/2019 | |
| WO | 2015/052864 A1 | 4/2015 | |
| WO | 2018/122798 A1 | 7/2018 | |
| WO | 2019/146527 A1 | 8/2019 | |

* cited by examiner

IMAGING DEVICE WITH EXTENDED EVENT SIGNAL DETECTION TIMING

CROSS REFERENCE TO RELATED APPLICATIONS

This application is a U.S. National Phase of International Patent Application No. PCT/JP2020/027361 filed on Jul. 14, 2020, which claims priority benefit of Japanese Patent Application No. JP 2019-171452 filed in the Japan Patent Office on Sep. 20, 2019. Each of the above-referenced applications is hereby incorporated herein by reference in its entirety.

TECHNICAL FIELD

The present technology relates to an imaging device, an imaging control method, and a program, and more particularly relates to a technology to detect changes in the amount of incident light.

BACKGROUND ART

There has been proposed an asynchronous solid-state imaging device provided with, at each pixel, a detection circuit that detects in real time that the amount of light at the pixel has exceeded a threshold value as an event signal. Such a solid-state imaging device that detects an event signal at each pixel is called a dynamic vision sensor (DVS).

CITATION LIST

Patent Document

Patent Document 1: WO 2018/122798 A

SUMMARY OF THE INVENTION

Problems to be Solved by the Invention

The asynchronous solid-state imaging device described above repeatedly executes a detection cycle with an event detection period to detect event signals, an event read period to read recorded event signals, a reset period to reset a threshold value for the detection of event signals, etc. as one cycle.

At this time, for example, if an event signal is generated immediately after the end of an event detection period, the generated event signal will not be detected until the next event detection period comes. Thus, event signal detection can be delayed, or a dead zone in which detection cannot be performed can arise.

The present technology has been created in view of such circumstances, and its object is to shorten dead zone periods during which event signal detection cannot be performed in an imaging device including a solid-state imaging device that detects event signals.

Solutions to Problems

An imaging device according to the present technology includes: a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result; and a control unit that performs control so that different pixel groups have different timing for an event detection period to cause the detection circuit to execute the event signal detection.

The event signal detection means, for example, detection of an event signal indicating that the amount of change in the electrical signal generated by the light-receiving portion is above or below the predetermined threshold value.

Thus, the event signal detection is performed with different timing for each pixel group of the solid-state imaging device, so that even when the event signal detection is not performed in a certain pixel group, the event signal detection may be performed in another pixel group.

Here, a pixel group refers to a plurality of pixels for which the control unit executes operation control with the same timing. The pixels of the pixel groups are not necessarily adjacent to each other.

In the imaging device according to the present technology described above, the detection circuit may execute, as the event signal detection, on event signal detection by comparing the amount of change in the electrical signal generated by the light-receiving portion with a first threshold value to obtain a detection result, and off event signal detection by comparing the amount of change in the electrical signal generated by the light-receiving portion with a second threshold value to obtain a detection result, and the control unit may perform operation control on the detection circuit of each pixel in a detection cycle including an on event detection period to cause the on event signal detection to be executed, an off event detection period to cause the off event signal detection to be executed, a reset period, and an event read period.

The on event signal detection means, for example, detection of an on event signal indicating that the amount of change in the electrical signal generated by the light-receiving portion is above a positive-side threshold value. Furthermore, the off event signal detection means, for example, detection of an off event signal indicating that the amount of change in the electrical signal generated by the light-receiving portion is below a negative-side threshold value.

By performing control so that each pixel group has different timing for the event detection period such as the on event detection period or the off event detection period, even in each period of the reset period and the event read period during which a certain pixel group does not execute the event signal detection, another pixel group executes the event signal detection.

In the imaging device according to the present technology described above, the control unit may perform control so that each pixel group has different timing for the on event detection period.

By performing control so that each pixel group has different timing for the on event detection period, even in each period of the off event detection period, the reset period, and the event read period during which a certain pixel group does not execute the on event signal detection, another pixel group executes the on event signal detection.

In the imaging device according the present technology described above, the control unit may perform control so that each pixel group has different timing for the off event detection period.

By performing control so that each pixel group has different timing for the off event detection period, even in each period of the on event detection period, the reset period, and the event read period during which a certain pixel group does not execute the off event signal detection, another pixel group executes the off event signal detection.

In the imaging device according to the present technology described above, the control unit may perform control so that when the detection circuit in each pixel of a first pixel group is in the on event detection period, the detection circuit in each pixel of a second pixel group is in the off event detection period.

Consequently, in the solid-state imaging device, the on event signal detection and the off event signal detection are performed in parallel in a certain period.

In the imaging device according to the present technology described above, the control unit may perform control so that when the detection circuit in each pixel of a first pixel group is in the on event detection period or the off event detection period, the detection circuit in each pixel of a second pixel group is in the event read period.

Even when the second pixel group is in the event read period during which the event signal detection is not performed, the first pixel group performs the on or off event signal detection. Thus, the solid-state imaging device as a whole performs at least the on or off event signal detection.

In the imaging device according to the present technology described above, the control unit may perform control so that when the detection circuit in each pixel of a first pixel group is in the on event detection period or the off event detection period, the detection circuit in each pixel of a second pixel group is in the reset period.

Even when the second pixel group is in the reset period during which the event signal detection is not performed, the first pixel group performs the on or off event signal detection. Thus, the solid-state imaging device as a whole performs at least the on or off event signal detection.

In the imaging device according to the present technology described above, the control unit may perform control so that a part of the on event detection period in the detection circuit of each pixel of a first pixel group coincides with a part of the on event detection period in the detection circuit of each pixel of a second pixel group.

By shifting the start timing of the on event detection period for each of the first pixel group and the second pixel group, their on event detection periods overlap each other.

In the imaging device according to the present technology described above, the control unit may perform control so that a part of the off event detection period in the detection circuit of each pixel of a first pixel group coincides with a part of the off event detection period in the detection circuit of each pixel of a second pixel group.

By shifting the start timing of the off event detection period for each of the first pixel group and the second pixel group, their off event detection periods overlap each other.

In the imaging device according to the present technology described above, the pixels of a first pixel group and the pixels of a second pixel group may be adjacent to each other. This can prevent creation of imbalances in the event signal detection depending on positions in a pixel arrangement region of the solid-state imaging device.

In the imaging device according to the present technology described above, the solid-state imaging device may have a laminated structure including a light-receiving chip provided with the light-receiving portions and a detection chip provided with the detection circuits. This improves the efficiency of circuit arrangement on the light-receiving chip and the detection chip.

An imaging control method according to the present technology includes: for a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result, executing, by an imaging device, control so that different pixel groups have different timing for an event detection period to cause the detection circuit to execute the event signal detection. Consequently, the event signal detection is performed with different timing for each pixel group of the solid-state imaging device.

A program according to the present technology is a program that causes an imaging device to execute each process corresponding to the above-described imaging control method. This allows the above-described control unit to be easily implemented by an information processing apparatus, a microcomputer, or the like. Furthermore, the above-described operation can be implemented by the imaging device including the control unit.

MODE FOR CARRYING OUT THE INVENTION

Figure 1:
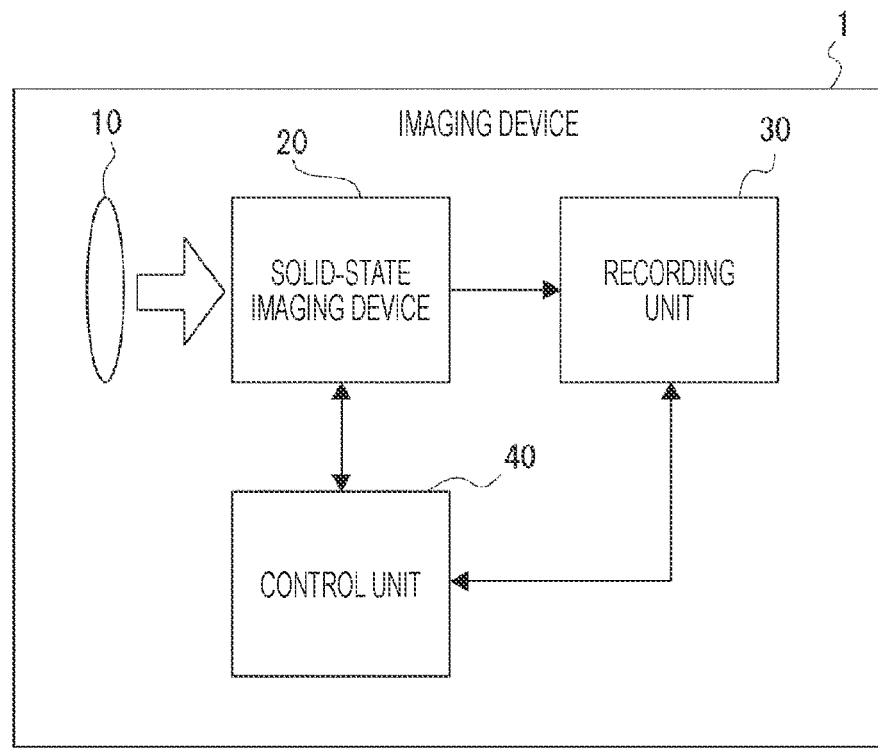
FIG. 1 is a block diagram of an imaging device according to an embodiment of the present technology.

Hereinafter, embodiments will be described in the following order.

<1. Configuration example of imaging device>
<2. Laminated structure of solid-state imaging device>
<3. Configuration example of event detection circuit>
<4. Pixel arrangement>
<5. Comparative example>
<6. First embodiment>
<7. Second embodiment>
<8. Third embodiment>
<9. Fourth embodiment>
<10. Summary>

Note that contents and structures once described are denoted by the same reference numerals after the description, and the description thereof will be omitted.

1. Configuration Example of Imaging Device

FIG. 1 is a block diagram illustrating a configuration example of an imaging device 1 according to an embodiment. The imaging device 1 has the functions of a DVS.

The imaging device 1 includes an imaging lens 10, a solid-state imaging device 20, a recording unit 30, and a control unit 40. The imaging device 1 may be, for example, a camera mounted on an industrial robot, a vehicle-mounted camera, a surveillance camera, etc.

The imaging lens 10 concentrates incident light onto the solid-state imaging device 20. The solid-state imaging device 20 photoelectrically converts the incident light to obtain voltage signals corresponding to the amounts of the received light, and performs event signal detection to detect changes in the amounts of the received light as event signals on the basis of the amounts of change in the voltage signals. The detected event signals are output to the recording unit 30.

The recording unit 30 records the event signals from the solid-state imaging device 20.

The control unit 40 includes a microcomputer including, for example, a central processing unit (CPU), read-only memory (ROM), random-access memory (RAM), etc., and controls the operation of the imaging device 1 by the CPU executing processing according to a program. In particular, the control unit 40 controls the solid-state imaging device 20 to cause it to execute the operation of the above-described event signal detection, controls the recording unit 30 to cause it to record event signals, and executes processing to read event signals from the recording unit 30.

2. Laminated Structure of Solid-State Imaging Device

Figure 2:
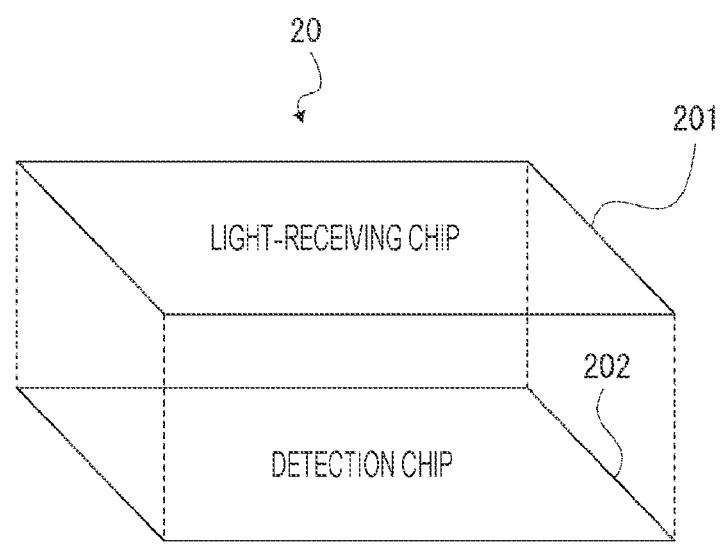
FIG. 2 is a diagram illustrating the laminated structure of a solid-state imaging device according to the embodiment.

FIG. 2 is a diagram illustrating an example of the laminated structure of the solid-state imaging device 20 according to the embodiment. The solid-state imaging device 20 includes a detection chip 202 and a light-receiving chip 201 placed on the detection chip 202 in layers. The light-receiving chip 201 and the detection chip 202 in such a laminated structure are electrically connected through connection portions such as vias. Note that the connection may be made by Cu—Cu bonding or bumps instead of through vias.

Figure 3:
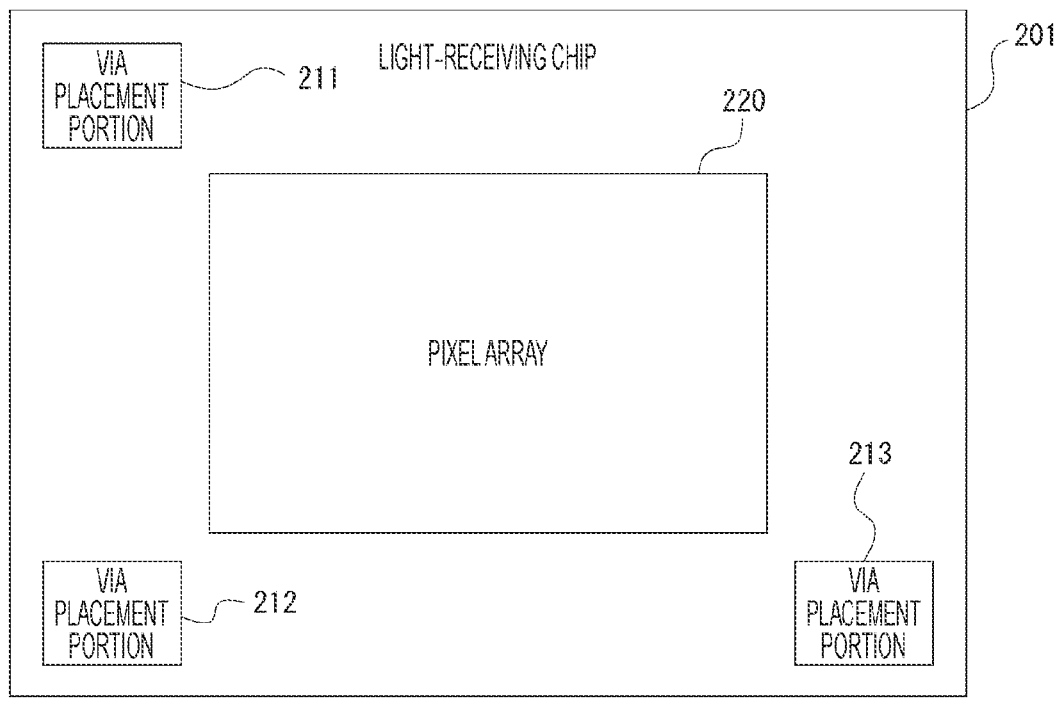
FIG. 3 is a plan view of a light-receiving chip according to the embodiment.

FIG. 3 is an example of a plan view of the light-receiving chip 201. The light-receiving chip 201 is provided with a pixel array 220 and via placement portions 211, 212, and 213. In the via placement portions 211, 212, and 213, vias connected to the detection chip 202 are placed.

Figure 4:
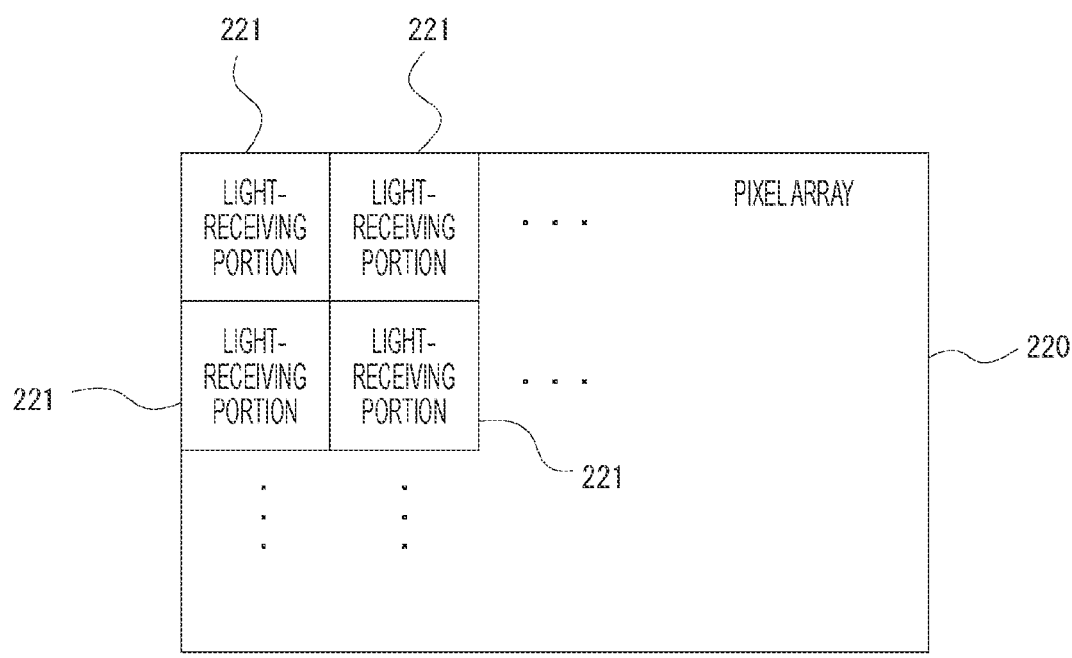
FIG. 4 is a plan view of a pixel array according to the embodiment.

FIG. 4 is an example of a plan view of the pixel array 220. In the pixel array 220, a plurality of light-receiving portions 221 is arranged in a two-dimensional gridlike pattern. The light-receiving portions 221 are, for example, photodiodes. The light-receiving portions 221 photoelectrically convert incident light to generate photocurrent. Each of the light-receiving portions 221 is assigned a pixel address including a row address and a column address.

Figure 5:
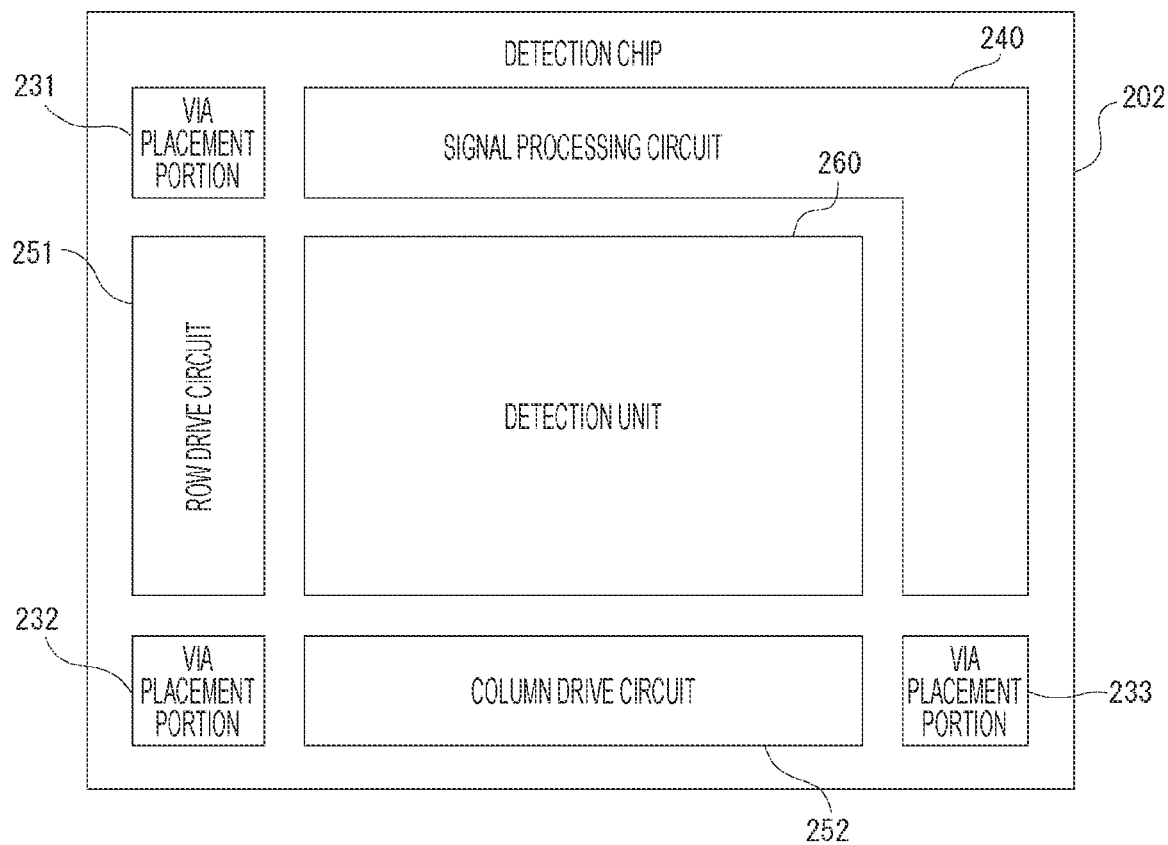
FIG. 5 is a plan view of a detection chip according to the embodiment.

FIG. 5 is an example of a plan view of the detection chip 202. The detection chip 202 is provided with via placement portions 231, 232, and 233, a signal processing circuit 240, a row drive circuit 251, a column drive circuit 252, and a detection unit 260. In the via placement portions 231, 232, and 233, vias connected to the light-receiving chip 201 are placed.

The row drive circuit 251 selects a row address of the pixel array 220 to cause photocurrent corresponding to the row address to be output to the detection unit 260. The column drive circuit 252 selects a column address of the pixel array 220 to cause photocurrent corresponding to the column address to be output to the detection unit 260.

The detection unit 260 detects event signals by quantizing voltage signals obtained by logarithmically converting input photocurrent, and outputs the detected event signals to the signal processing circuit 240. An event signal is detected when the amount of change in a voltage signal obtained by logarithmically converting photocurrent is above or below a predetermined threshold value. An event signal is a signal quantized (binarized) by a quantizer 330 described later.

The signal processing circuit 240 performs predetermined signal processing on the event signals output from the detection unit 260, and outputs them to the recording unit 30.

Figure 6:
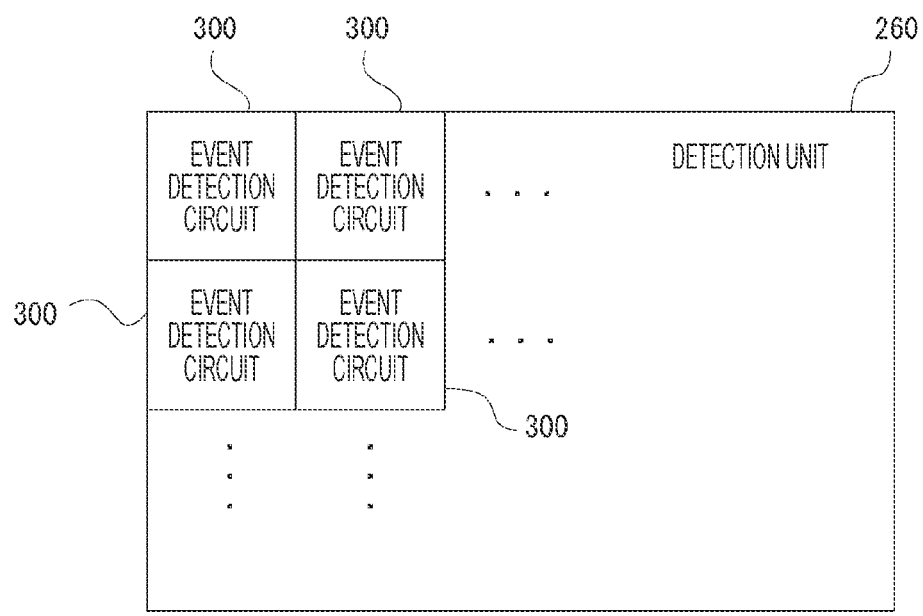
FIG. 6 is a plan view of a detection unit according to the embodiment.

FIG. 6 is an example of a plan view of the detection unit 260. In the detection unit 260, a plurality of event detection circuits 300 is arranged in a two-dimensional gridlike pattern. Each event detection circuit 300 is assigned a pixel address and is connected to the light-receiving portion 221 of the same address.

Each event detection circuit 300 quantizes a voltage signal corresponding to photocurrent from the corresponding light-receiving portion 221 and outputs it as an event signal.

3. Configuration Example of Event Detection Circuit

Figure 7:
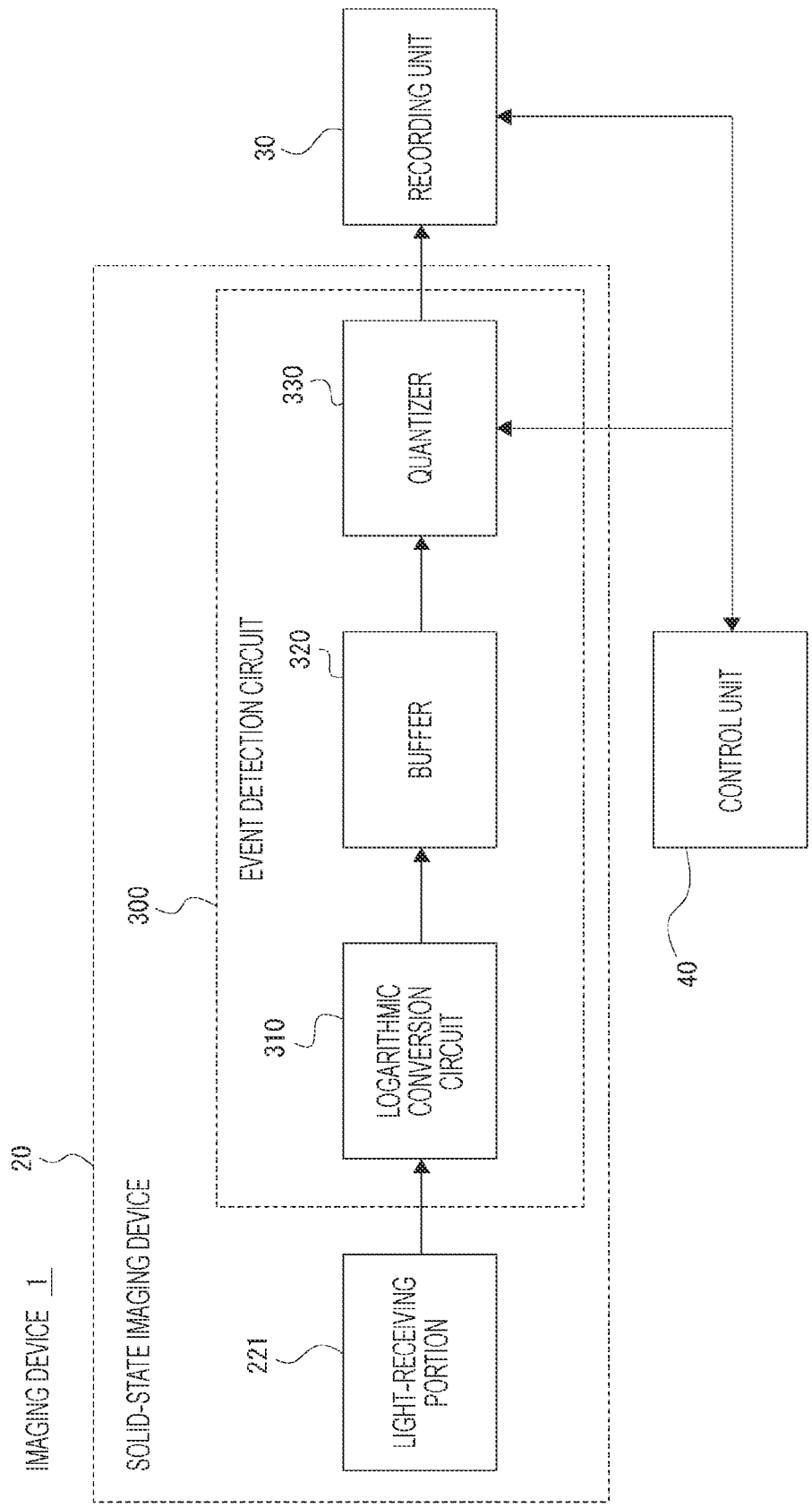
FIG. 7 is a block diagram illustrating the configuration of a detection circuit according to the embodiment.

FIG. 7 is a block diagram illustrating an example of the configuration of each event detection circuit 300 according to the embodiment. Each event detection circuit 300 includes a logarithmic conversion circuit 310, a buffer 320, and the quantizer 330.

The logarithmic conversion circuit 310 converts photocurrent from the corresponding light-receiving portion 221 into a logarithmically converted voltage signal. The logarithmic conversion circuit 310 provides the converted voltage signal to the buffer 320.

The buffer 320 corrects the voltage signal from the logarithmic conversion circuit 310. The buffer 320 outputs the corrected voltage signal to the quantizer 330.

The quantizer 330 performs event signal detection by comparing the amount of change in the input voltage signal with a predetermined threshold value to detect an event signal indicating that it is above or below the threshold value. The quantizer 330 quantizes the reduced voltage signal into a digital signal and outputs it as a detection signal to the recording unit 30.

The control unit 40 performs operation control on the quantizer 330 and reads the detection signal recorded in the storage unit 30.

Figure 8:
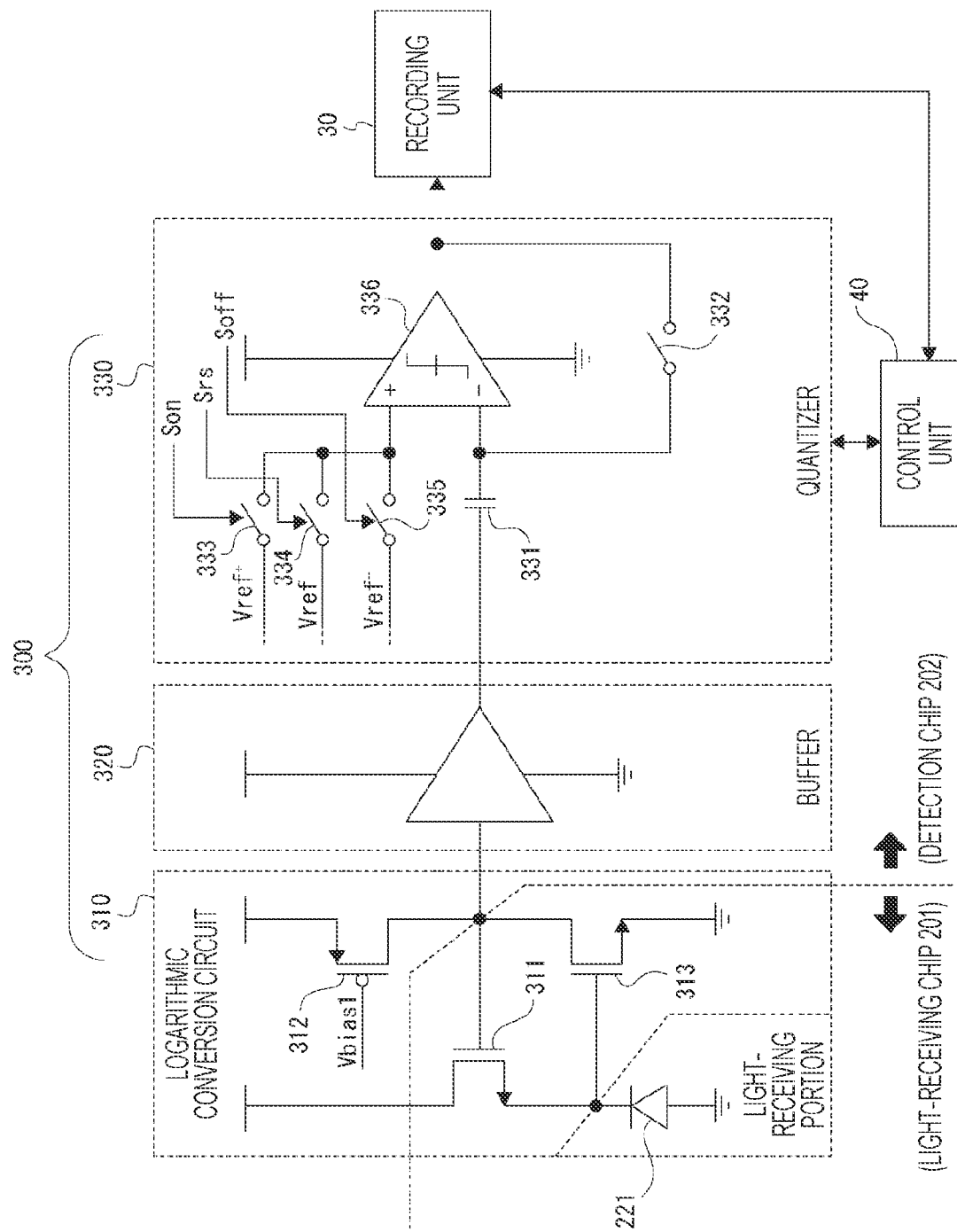
FIG. 8 is a circuit diagram illustrating the configuration of the detection circuit according to the embodiment.

FIG. 8 is a circuit diagram illustrating an example of the configuration of each event detection circuit 300. The logarithmic conversion circuit 310 includes N-type transistors 311 and 313 and a P-type transistor 312. As these transistors, for example, metal-oxide-semiconductor (MOS) transistors are used.

The source of the N-type transistor 311 is connected to the cathode of the light-receiving portion 221, and the drain thereof is connected to a power supply line. The P-type transistor 312 and the N-type transistor 313 are connected in series between the power supply line and a ground. Furthermore, a point of connection between the P-type transistor 312 and the N-type transistor 313 is connected to the gate of the N-type transistor 311 and to the input terminal of the buffer 320. Furthermore, a predetermined bias voltage Vbias1 is applied to the gate of the P-type transistor 312.

The drains of the N-type transistors 311 and 313 are connected to the power supply side. Such circuits are called source followers. The two source followers connected in a loop convert photocurrent from the light-receiving portion 221 into a logarithmically converted voltage signal. Furthermore, the P-type transistor 312 supplies a constant current to the N-type transistor 313.

The logarithmic conversion circuit 310 described above converts the intensity of light received by the light-receiving portion 221 into a logarithmically converted voltage signal.

Note that the ground of the light-receiving chip 201 and the ground of the detection chip 202 are separated from each other as a measure against interference. Furthermore, the light-receiving portion 221 and the N-type transistors 311 and 313 of the event detection circuit 300 are placed on the light-receiving chip 201, and the event detection circuit 300 other than the N-type transistors 311 and 313 is placed on the detection chip 202.

The quantizer 330 includes a capacitor 331, switching elements 332, 333, 334, and 335, and a comparator 336. Each switching element is brought into conduction according to an operation control signal from the control unit 40. For example, MOS transistors are used as the switching elements 332, 333, 334, and 335.

One end of the capacitor 331 is connected to the output terminal of the buffer 320, and the other end thereof is connected to the inverting input terminal of the comparator 336. Thus, a voltage as the amount of change in a voltage signal from the buffer 320 becomes a voltage signal input to the comparator 336. That is, a voltage signal corresponding to the detected amount of change in brightness generated by photoelectric conversion is input to the inverting input terminal of the comparator 336.

A comparison reference voltage (Vref+, Vref, or Vref−) is input to the non-inverting input terminal of the comparator 336.

The switching element 332 turns on and off between the output terminal and the inverting input terminal of the comparator 336 according to an operation control signal from the control unit 40. A reset operation is performed by bringing the switching element 332 and the switching element 334 into conduction.

The switching elements 333, 334, and 335 make three corresponding paths connected to the non-inverting input terminal of the comparator 336 electrically continuous according to operation control signals Son, Srs, and Soff from the control unit 40. An operation control signal (an ON control signal Son, a reset control signal Srs, or an OFF control signal Soff) from the control unit 40 brings one of the switching elements 333, 334, and 335 corresponding to the respective operation control signals into conduction, so that a comparison reference voltage (Vref+, Vref, or Vref−) corresponding to the operation control signal is selectively input to the non-inverting input terminal of the comparator 336.

The comparator 336 performs event signal detection by comparing the voltage signal input to the inverting input terminal with the comparison reference voltage input to the non-inverting input terminal to output an event signal depending on a detection result. The event signal is output from the comparator 336 and recorded in the recording unit 30.

The control unit 40 performs operation control on the event detection circuit 300 in a time division manner, using the ON control signal Son, the reset control signal Srs, and the OFF control signal Soff.

The control unit 40 brings the switching element 333 into conduction by the ON control signal Son. Consequently, the comparison reference voltage Vref+ on the positive side is input to the non-inverting input terminal of the comparator 336. The comparator 336 performs on event signal detection by comparing the amount of change in the voltage signal input with the comparison reference voltage Vref+ to output an on event signal when the voltage signal is above the comparison reference voltage Vref+. The on event signal output from the comparator 336 is recorded in the recording unit 30.

Hereinafter, a period during which the on event signal detection is performed will be described as an on event detection period DET1.

Furthermore, the control unit 40 executes processing to read the recorded on event signal from the storage unit 30. Hereinafter, a period during which the on event signal is read will be described as an on event read period Ron.

The control unit 40 brings the switching element 335 into conduction by the OFF control signal Soff. Consequently, the comparison reference voltage Vref− on the negative side is input to the non-inverting input terminal of the comparator 336. The comparator 336 performs off event signal detection by comparing the amount of change in the voltage signal input with the comparison reference voltage Vref− to output an off event signal when the voltage signal is below the comparison reference voltage Vref−. The off event signal output from the comparator 336 is recorded in the recording unit 30.

Hereinafter, a period during which the off event signal detection is performed will be described as an off event detection period DET2.

Furthermore, the control unit 40 executes processing to read the recorded off event signal from the storage unit 30. Hereinafter, a period during which the off event signal is read will be described as an off event read period Roff.

The control unit 40 brings the switching elements 332 and 334 into conduction by the reset control signal Srs. Consequently, the comparison reference voltage varied by the ON control signal Son and the OFF control signal Soff is reset in the event detection circuit 300.

Hereinafter, a period during which the comparison reference voltage is reset will be described as a reset period RST.

Figure 9:
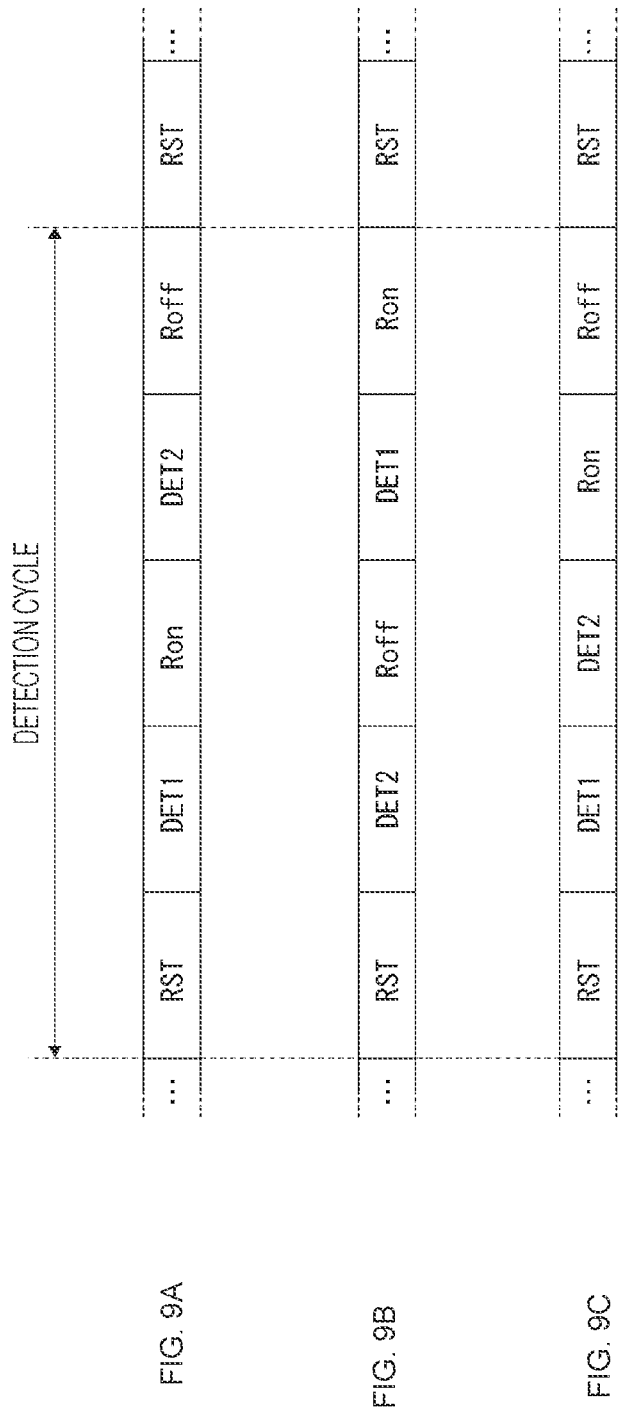
FIGS. 9A, 9B, and 9C are diagrams illustrating periods constituting a detection cycle according to the embodiment.

FIGS. 9A, 9B, and 9C are diagrams illustrating the periods constituting one detection cycle. Note that in the following description, for explanatory convenience, all the periods, the reset period RST, the on event detection period DET1, the on event read period Ron, the off event detection period DET2, and the off event read period Roff, are illustrated with the same period length, which is an example. For example, the period length of the reset period RST may be shorter than those of the other periods, or the on event detection period DET1 and the on event read period Ron may have different period lengths.

For example, as illustrated in FIG. 9A, the control unit 40 executes the operation control corresponding to each period so that one detection cycle is in the order of the reset period RST, the on event detection period DET1, the on event read period Ron, the off event detection period DET2, and the off event read period Roff.

Note that the order of the periods in the detection cycle is not limited to the above and may be set in various orders. For example, as illustrated in FIG. 9B, the control unit 40 may execute the operation control so that one detection cycle is in the order of the reset period RST, the on event detection period DET1, the on event read period Ron, the off event detection period DET2, and the off event read period Roff.

Furthermore, for example, as illustrated in FIG. 9C, the control unit 40 may execute the operation control so that the detection cycle is in the order of the reset period RST, the on event detection period DET1, the off event detection period DET2, the on event read period Ron, and the off event read period Roff.

4. Pixel Arrangement

Figure 10:
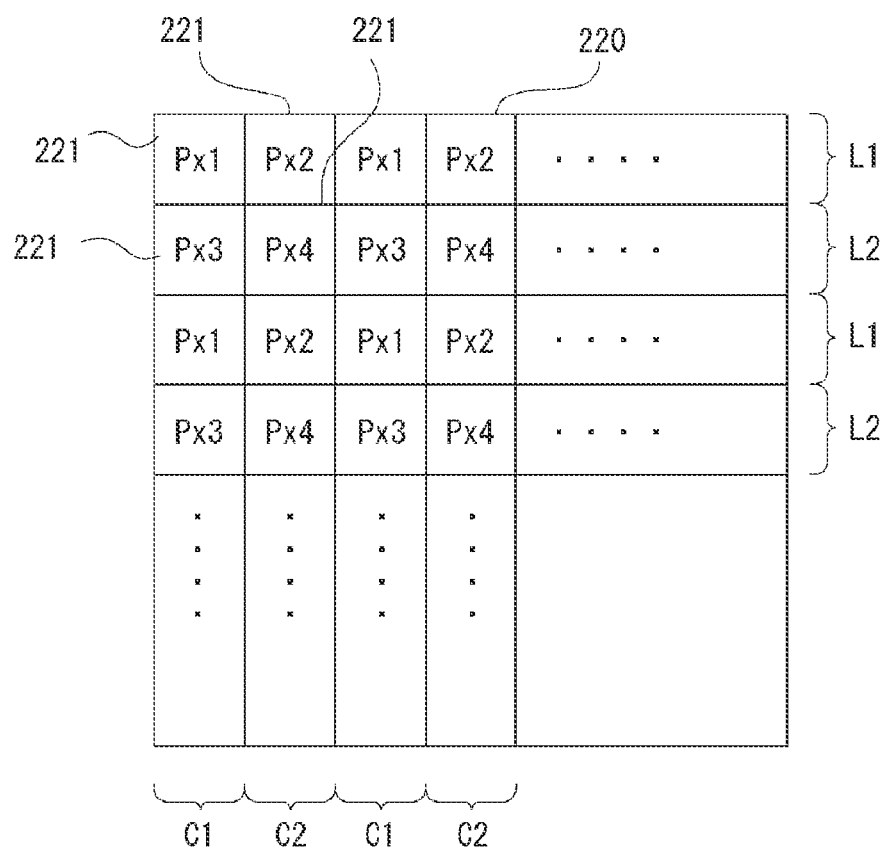
FIG. 10 is a diagram illustrating an example of the arrangement of pixels according to the embodiment.

FIG. 10 is a diagram illustrating an example of the arrangement of pixels Px. The solid-state imaging device 20 is provided with a plurality of pixels Px.

Here, in the present disclosure, each pixel Px refers to a set of one light-receiving portion 221 (photoelectric conversion element) and the corresponding event detection circuit 300.

In the solid-state imaging device 20, the plurality of pixels Px is arranged in a two-dimensional gridlike pattern.

For explanatory convenience, in FIG. 10, pixels Px1, Px2, Px3, and Px4 are illustrated separately in units of four pixels. Note that the pixels Px1, Px2, Px3, and Px4 do not have different physical structures or characteristics, and are pixels formed in the same structure.

The pixel array 220 is provided with first columns C1 in which the pixels Px1 and Px3 are alternately arranged in the column direction, and second columns C2 in which the pixels Px2 and Px4 are alternately arranged in the column direction. The first columns C1 and the second columns C2 are alternately arranged side by side in the row direction.

Furthermore, the pixel array 220 is provided with first rows L1 in which the pixels Px1 and Px2 are alternately arranged in the row direction, and second rows L2 in which the pixels Px3 and Px4 are alternately arranged in the row direction. The first rows L1 and the second rows L2 are alternately arranged side by side.

At this time, the pixels Px1 and the pixels Px2, the pixels Px1 and the pixels Px3, the pixels Px2 and the pixels Px4, and the pixels Px3 and the pixels Px4 are arranged next to each other.

In the present embodiment, the pixels Px arranged in the pixel array 220 are classified into a plurality of pixel groups PxG as illustrated in, for example, FIG. 12 described later.

For example, a plurality of pixels indicated as the pixels Px1 and the pixels Px4 is set as a first pixel group PxG1, and a plurality of pixels indicated as the pixels Px2 and the pixels Px3 is set as a second pixel group PxG2.

Here, a pixel group refers to that including a plurality of pixels having the same timing in the operation control of the event detection circuits 300 by the control unit 40.

For example, the control unit 40 executes the operation control on the event detection circuits 300 with the same timing for all the pixels Px1 and all the pixels Px4 included in the first pixel group PxG1, and executes the operation control on the event detection circuits 300 of each pixel Px with the same timing for all the pixels Px2 and all the pixels Px3 included in the second pixel group PxG2.

As will be described in detail later, the control unit 40 according to the embodiment executes the operation control so that the operation timing of the event detection circuits 300 in the first pixel group PxG1 is a timing different from the operation timing of the event detection circuits 300 in the second pixel group PxG2.

5. Comparative Example

Figure 11:
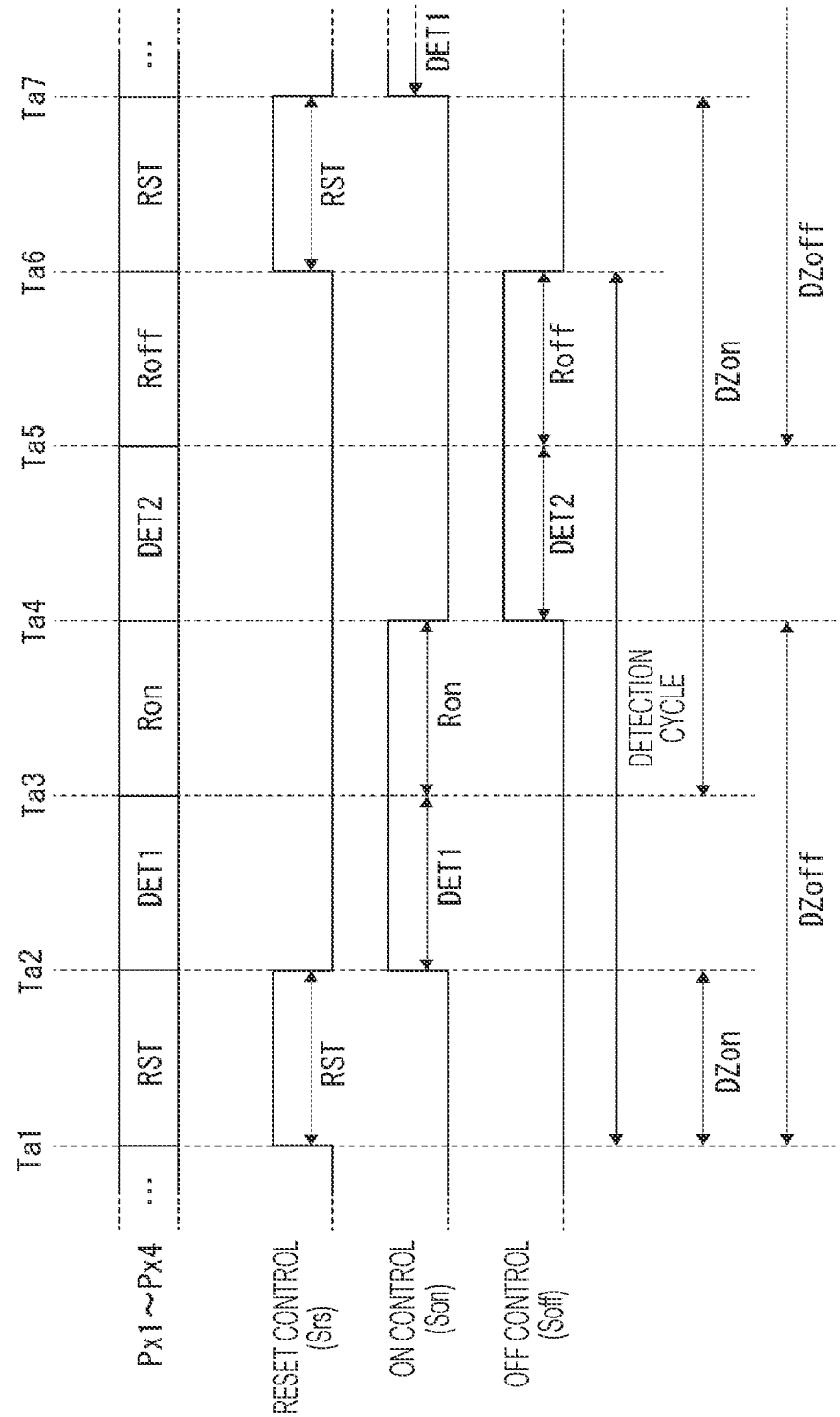
FIG. 11 is a timing chart of operation control in the periods according to a comparative example.

Here, prior to the operation of the embodiment, a case where all the pixels Px (the pixels Px1 to the pixels Px4) provided in the pixel array 220 are controlled with the same timing will be described as a comparative example with reference to FIG. 11. FIG. 11 is a timing chart of the control of the operations by the control unit 40.

During a period from a time point Ta1 to a time point Ta2, the control unit 40 sets the reset control signal Srs to an H level to reset the detection operation of the event detection circuits 300.

Thereafter, at the time point Ta2, the control unit 40 sets the reset control signal Srs to an L level to end the reset period RST.

During a period from the time point Ta2 to a time point Ta3, the control unit 40 sets the ON control signal Son to an H level. Consequently, the comparison reference voltage Vref+ on the positive side is input to the non-inverting input terminal of the comparator 336 for every pixel Px. Thus, the on event signal detection is performed in which the on event signal is output when the amount of change in the voltage signal input to the inverting input terminal is above the comparison reference voltage Vref+. The on event signal output from the comparator 336 is recorded in the recording unit 30.

Thereafter, during a period from the time point Ta3 to a time point Ta4, as indicated as the on event read period Ron, the control unit 40 executes reading of the on event signals recorded in the recording unit 30. At the time point Ta4, the control unit 40 sets the ON control signal Son to an L level.

Subsequently, during a period from the time point Ta4 to a time point Ta5, the control unit 40 sets the OFF control signal Soff to an H level. Consequently, the comparison reference voltage Vref− on the negative side is input to the non-inverting input terminal of the comparator 336 for every pixel Px. Thus, the off event signal detection is performed in which the off event signal is output when the amount of change in the voltage signal input to the inverting input terminal is below the comparison reference voltage Vref−. The off event signal output from the comparator 336 is recorded in the recording unit 30.

Thereafter, during a period from the time point Ta5 to a time point Ta6, as indicated as the off event read period Roff, the control unit 40 executes reading of the off event signals recorded in the recording unit 30. At the time point Ta6, the control unit 40 sets the OFF control signal Soff to an L level.

With the time point Ta1 to the time point Ta6 above as one cycle of a detection period (detection cycle), similar operation is performed at and after the time point Ta6.

In the comparative example, the operation control is performed with the same timing for all the pixels Px provided in the solid-state imaging device 20. Therefore, for example, when the on event detection period DET1 has elapsed in a certain detection cycle, the on event signal detection is not performed until the on event detection period DET1 in the next detection cycle. Then, a dead zone DZon in which the on event signal detection is not performed arises for a period of time from the end of the on event detection period DET1 until the next on event detection period DET1 comes.

Therefore, the on event signals may not be able to be detected for changes in the voltage signals that have occurred during the dead zone DZon, or a delay time may arise between the occurrence and the detection of an actual on event. The same applies to a dead zone DZoff, a period during which the off event signal detection is not performed, which arises from the end of the off event detection period DET2 until the next off event detection period DET2 comes.

Such dead zones affect time accuracy and responsiveness in the event signal detection. Thus, it is desirable to shorten dead zone periods to improve the accuracy of the detection of the event signals in the time-axis direction.

Therefore, in the present embodiment, the pixels Px are classified into the plurality of pixel groups PxG, and the control unit 40 performs the operation control with different timing for each pixel group PxG to shorten the dead zone periods. Details thereof will be described in the following embodiments.

6. First Embodiment

A first embodiment will be described with reference to FIGS. 12 to 15. In the first embodiment, the pixels Px provided in the pixel array 220 are classified into the plurality of pixel groups PxG, and the operation control by the control unit 40 is performed with different timing for each pixel group PxG.

Figure 12:
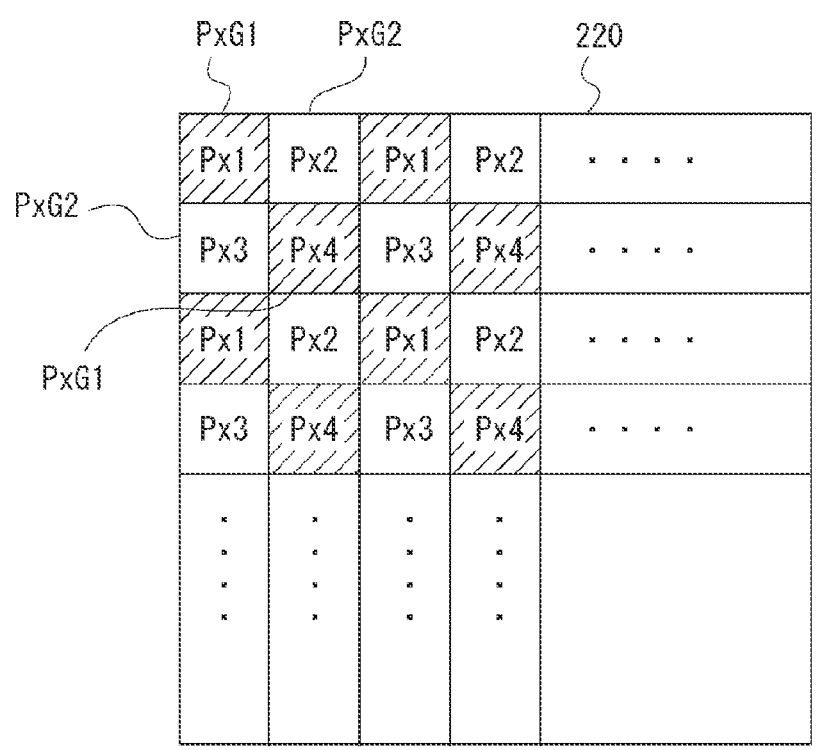
FIG. 12 is a diagram illustrating the pixels classified into a plurality of pixel groups according to a first embodiment.

FIG. 12 is a diagram illustrating the pixels Px arranged in the pixel array 220 classified into the plurality of pixel groups PxG. Here, the pixels Px indicated as the pixels Px1 to Px4 arranged in the pixel array 220 are classified into a first pixel group PxG1 including the pixels Px1 and the pixels Px4 hatched, and a second pixel group PxG2 including the pixels Px2 and the pixels Px3 not hatched.

The pixels Px1 of the first pixel group PxG1 and the pixels Px2 of the second pixel group PxG2 are arranged next to each other in the row direction, and the pixels Px1 of the first pixel group PxG1 and the pixels Px3 of the second pixel group PxG2 are arranged next to each other in the column direction. Further, the pixels Px3 of the second pixel group PxG2 and the pixels Px4 of the first pixel group PxG1 are arranged next to each other in the row direction, and the pixels Px2 of the second pixel group PxG2 and the pixels Px4 of the first pixel group PxG1 are arranged next to each other in the column direction.

Figure 13:
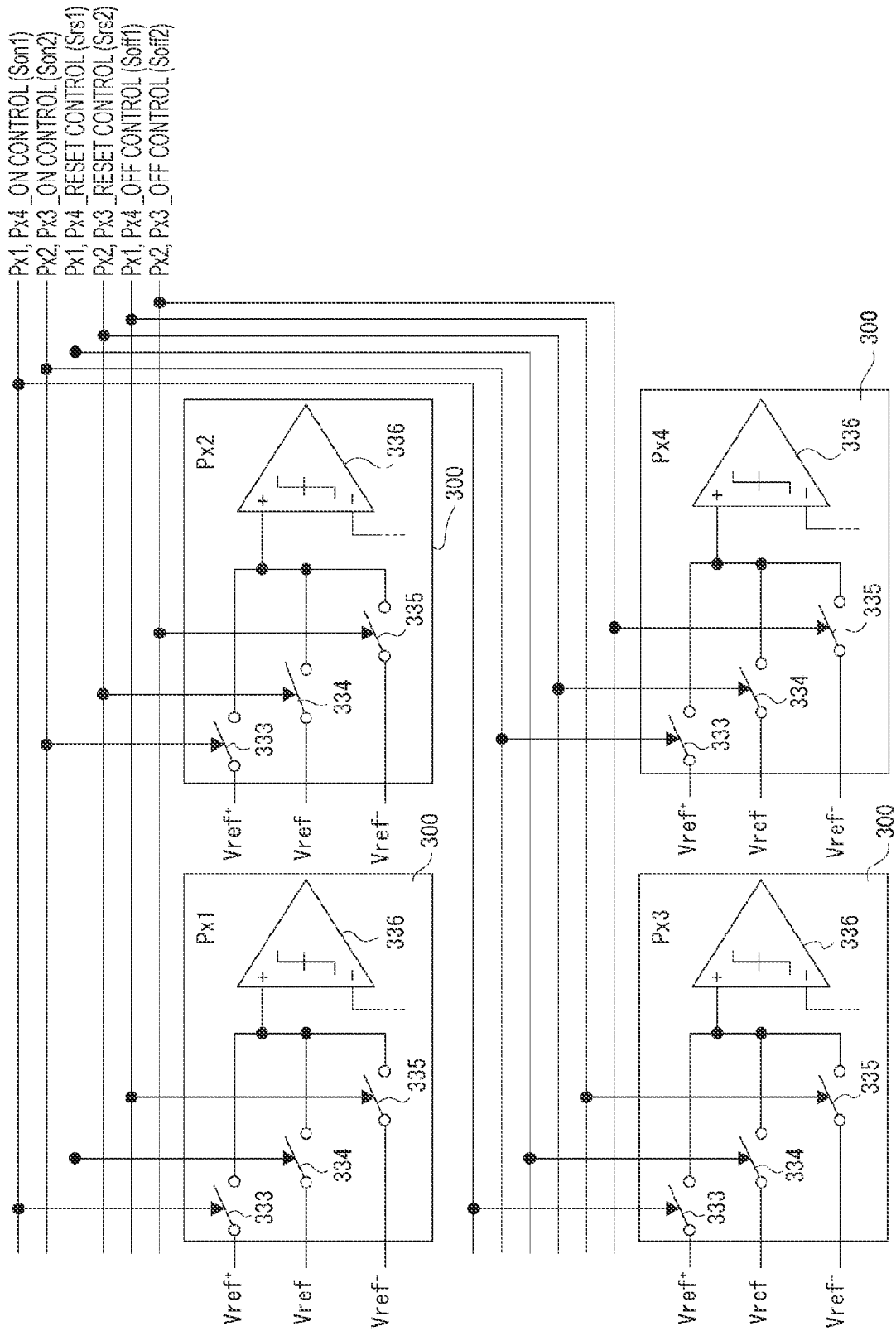
FIG. 13 is a diagram illustrating an outline of operation control on the pixels according to the first embodiment.

As illustrated in FIG. 13, the control unit 40 executes the operation control based on operation control signals (an ON control signal Son1, a reset control signal Srs1, and an OFF control signal Soff1) on the event detection circuits 300 for all the pixels Px1 and all the pixels Px4 included in the first pixel group PxG1.

Furthermore, the control unit 40 executes the operation control on the event detection circuits 300 based on operation control signals (an ON control signal Son2, a reset control signal Srs2, and an OFF control signal Soff2) for all the pixels Px2 and all the pixels Px3 included in the second pixel group PxG2.

This allows the control unit 40 to control the operation of the first pixel group PxG1 and the second pixel group PxG2 with different timing.

Figure 14:
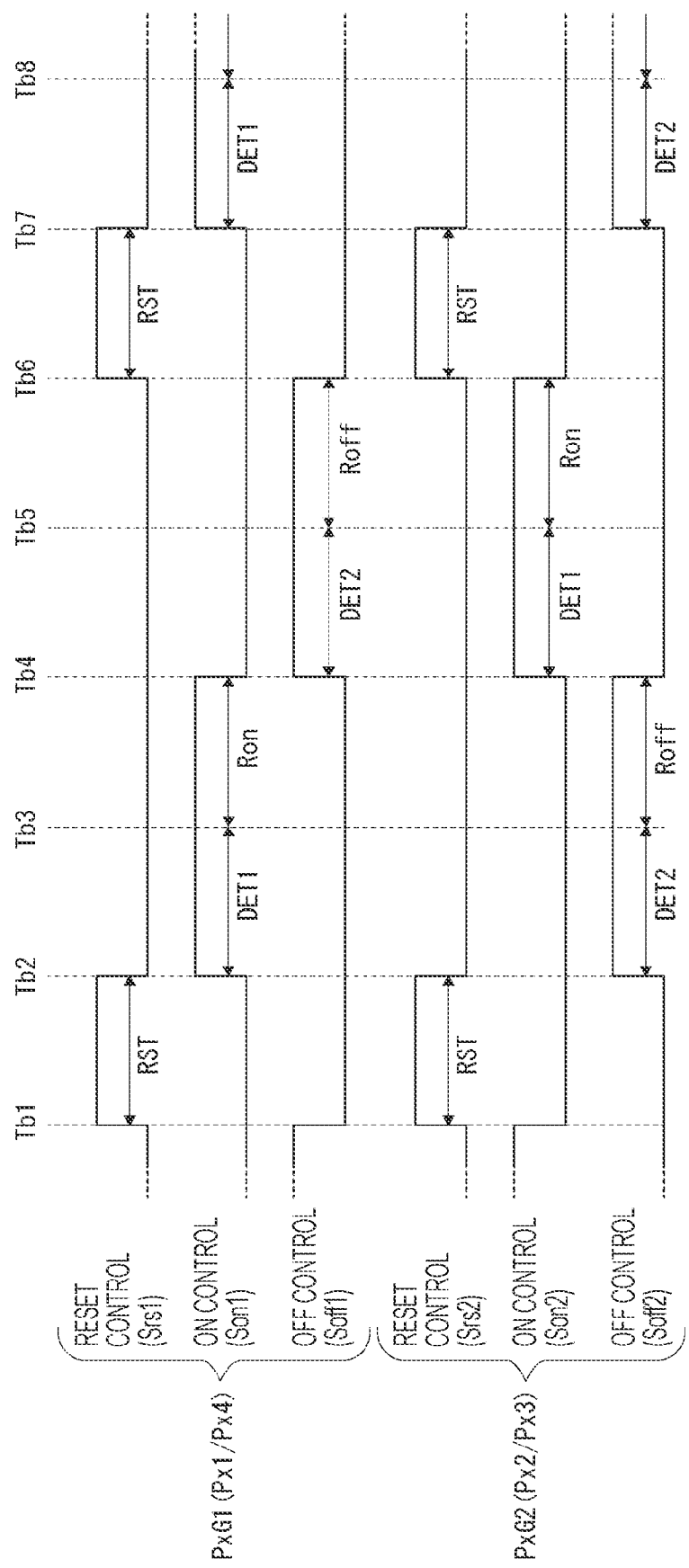
FIG. 14 is a timing chart of the operation control in the periods according to the first embodiment.

FIG. 14 is a timing chart of the operation control on the pixel groups PxG by the control unit 40. First, the operation control on the first pixel group PxG1 by the control unit 40 will be described.

During a period from a time point Tb1 to a time point Tb2, the control unit 40 sets the reset control signal Srs1 to an H level to reset the detection operation of the event detection circuits 300 for the pixels Px1 and Px4 of the first pixel group PxG1. At the time point Ta2, the control unit 40 sets the reset control signal Srs1 to an L level to end the reset period RST.

During a period from the time point Tb2 to a time point Tb3, the control unit 40 sets the ON control signal Son1 to an H level. Consequently, the comparison reference voltage Vref+ on the positive side is input to the non-inverting input terminal of the comparator 336 in each of the pixels Px1 and Px4 of the first pixel group PxG1. Thus, the on event signal detection is performed in which the on event signal is output when the amount of change in the voltage signal input to the inverting input terminal is above the comparison reference voltage Vref+. The on event signal output from the comparator 336 is recorded in the recording unit 30.

Thereafter, during a period from the time point Tb3 to a time point Tb4, as indicated as the on event read period Ron, the control unit 40 executes reading of the on event signals on the pixels Px1 and Px4 of the first pixel group PxG1 recorded in the recording unit 30. At the time point Tb4, the control unit 40 sets the ON control signal Son to an L level.

Subsequently, during a period from the time point Tb4 to a time point Tb5, the control unit 40 sets the OFF control signal Soff1 to an H level. Consequently, the comparison reference voltage Vref- on the negative side is input to the non-inverting input terminal of the comparator 336 in each of the pixels Px1 and Px4 of the first pixel group PxG1. Thus, the off event signal detection is performed in which the off event signal is output when the amount of change in the voltage signal input to the inverting input terminal is below the comparison reference voltage Vref-. The off event signal output from the comparator 336 is recorded in the recording unit 30.

Thereafter, during a period from the time point Tb5 to a time point Tb6, as indicated as the off event read period Roff, the control unit 40 executes reading of the off event signals on the pixels Px1 and Px4 of the first pixel group PxG1 recorded in the recording unit 30. At the time point Tb6, the control unit 40 sets the OFF control signal Soff1 to an L level.

With the time point Tb1 to the time point Tb6 above as one cycle of a detection period (detection cycle), similar operation is performed at and after the time point Tb6.

Figure 15:
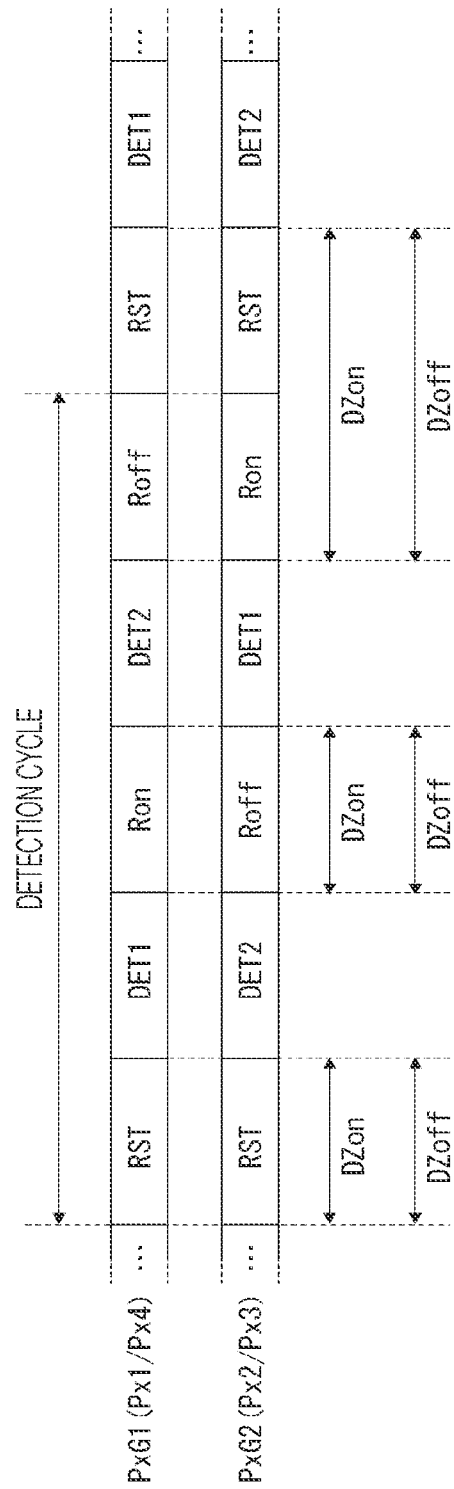
FIG. 15 is a diagram illustrating the respective detection cycles of the pixel groups according to the first embodiment.

Thus, as illustrated in FIG. 15, the detection cycle in the first pixel group PxG1 is in the order of the reset period RST, the on event detection period DET1, the on event read period Ron, the off event detection period DET2, and the off event read period Roff.

Next, the operation control on the second pixel group PxG2 by the control unit 40 will be described.

During the period from the time point Tb1 to the time point Tb2, the control unit 40 sets the reset control signal Srs2 to an H level to reset the detection operation of the event detection circuits 300 in the pixels Px2 and Px3 of the second pixel group PxG2. At the time point Tb2, the control unit 40 sets the reset control signal Srs2 to an L level to end the reset period RST.

Subsequently, during the period from the time point Tb2 to the time point Tb3, the control unit 40 sets the OFF control signal Soff2 to an H level, so that the off event signal detection is performed in the pixels Px2 and Px3 of the second pixel group PxG2. Detected off event signals are recorded in the recording unit 30.

Thereafter, during the period from the time point Tb3 to the time point Tb4, as indicated as the off event read period Roff, the control unit 40 executes reading of the off event signals on the pixels Px2 and Px3 of the second pixel group PxG2 recorded in the recording unit 30. At the time point Tb4, the control unit 40 sets the OFF control signal Soff2 to an L level.

During the period from the time point Tb4 to the time point Tb5, the control unit 40 sets the ON control signal Son2 to an H level, so that the on event signal detection is performed in the pixels Px2 and Px3 of the second pixel group PxG2. Detected on event signals are recorded in the recording unit 30.

Thereafter, during the period from the time point Tb5 to the time point Tb6, as indicated as the on event read period Ron, the control unit 40 executes reading of the on event signals on the pixels Px2 and Px3 of the second pixel group PxG2 recorded in the recording unit 30. At the time point Tb6, the control unit 40 sets the ON control signal Son2 to an L level.

With the time point Tb1 to the time point Tb6 above as one cycle of a detection period (detection cycle), similar operation is performed at and after the time point Tb6.

Thus, as illustrated in FIG. 15, the detection cycle in the second pixel group PxG2 is in the order of the reset period RST, the off event detection period DET2, the off event read period Roff, the on event detection period DET1, and the on event read period Ron.

According to the above first embodiment, the control unit 40 executes the operation control so that when the pixels Px1 and Px4 of the first pixel group PxG1 are in the on event detection period DET1, the pixels Px2 and Px3 of the second pixel group PxG2 are in the off event detection period DET2. Furthermore, the control unit 40 executes the operation control so that when the pixels Px2 and Px3 of the second pixel group PxG2 are in the on event detection period DET1, the pixels Px1 and Px4 of the first pixel group PxG1 are in the off event detection period DET2.

It is highly likely that changes in the amounts of light incident on the light-receiving portions 221 due to the movement of a subject can be similarly detected by the adjacent pixels Px (the pixels Px1 and the pixels Px2, and the pixels Px3 and the pixels Px4). Thus, even when a certain pixel Px is in the dead zone DZon or DZoff in which the event detection is not performed, another adjacent pixel Px performs the event detection, so that the dead zone DZon or DZoff of the certain pixel Px can be compensated for.

Here, the detection cycles are set such that the on event detection period DET1 and the off event detection period DET2 have different timing between the first pixel group PxG1 and the second pixel group PxG2. Consequently, in the first embodiment, the periods of the dead zone DZon in which the on event signal detection is not performed and the dead zone DZoff in which the off event signal detection is not performed can be shortened as compared with a case where the on event signal detection and the off event signal detection are performed by all the pixels Px as in the comparative example.

Note that the first embodiment has described the example in which the pixels Px1 and Px4 are set as the first pixel group PxG1 and the pixels Px2 and Px3 as the second pixel group PxG2 as illustrated in FIG. 12, but various other examples can be considered for a combination of the pixels Px in each pixel group PxG.

Figure 16:
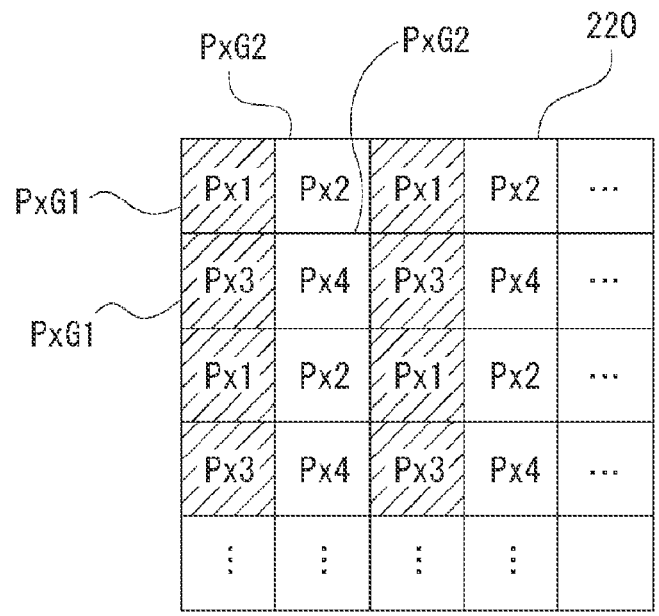
FIG. 16 is a diagram illustrating the pixels classified into a plurality of pixel groups according to the first embodiment.

For example, as illustrated in FIG. 16, the first pixel group PxG1 and the second pixel group PxG2 may be set on a column-by-column basis in the pixel array 220. In this case, the pixels Px1 and Px3 are set as the first pixel group PxG1, and the pixels Px2 and Px4 are set as the second pixel group PxG2.

Figure 17:
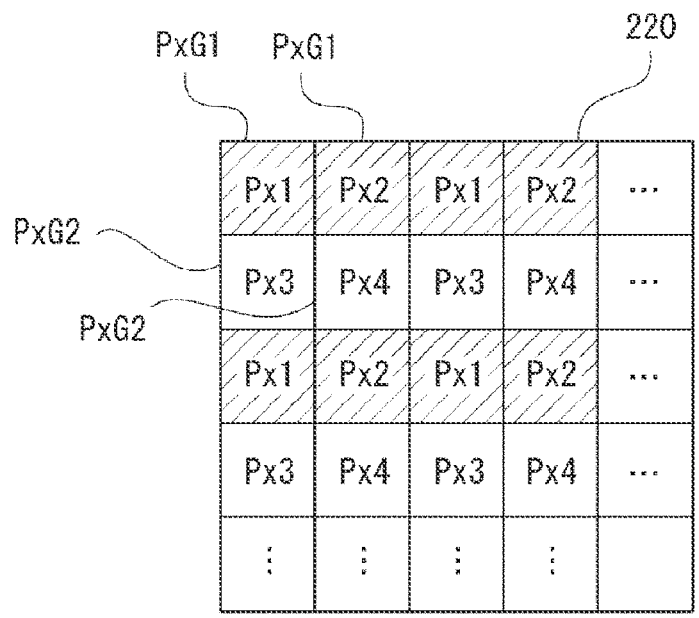
FIG. 17 is a diagram illustrating the pixels classified into a plurality of pixel groups according to the first embodiment.

Furthermore, as illustrated in FIG. 17, the first pixel group PxG1 and the second pixel group PxG2 may be set on a row-by-row basis in the pixel array 220. In this case, the pixels Px1 and Px2 are set as the first pixel group PxG1, and the pixels Px3 and Px4 are set as the second pixel group PxG2.

7. Second Embodiment

A second embodiment will be described with reference to FIGS. 18 and 19. In an example of the second embodiment, a case will be described in which a different detection cycle is set for each pixel group PxG, and then the phase of the detection cycle is shifted for each pixel group PxG.

In the second embodiment, as in the first embodiment, the pixels Px arranged in the pixel array 220 are classified into the first pixel group PxG1 including the pixels Px1 and the pixels Px4 hatched, and the second pixel group PxG2 including the pixels Px2 and the pixels Px3 not hatched (see FIG. 12).

Figure 18:
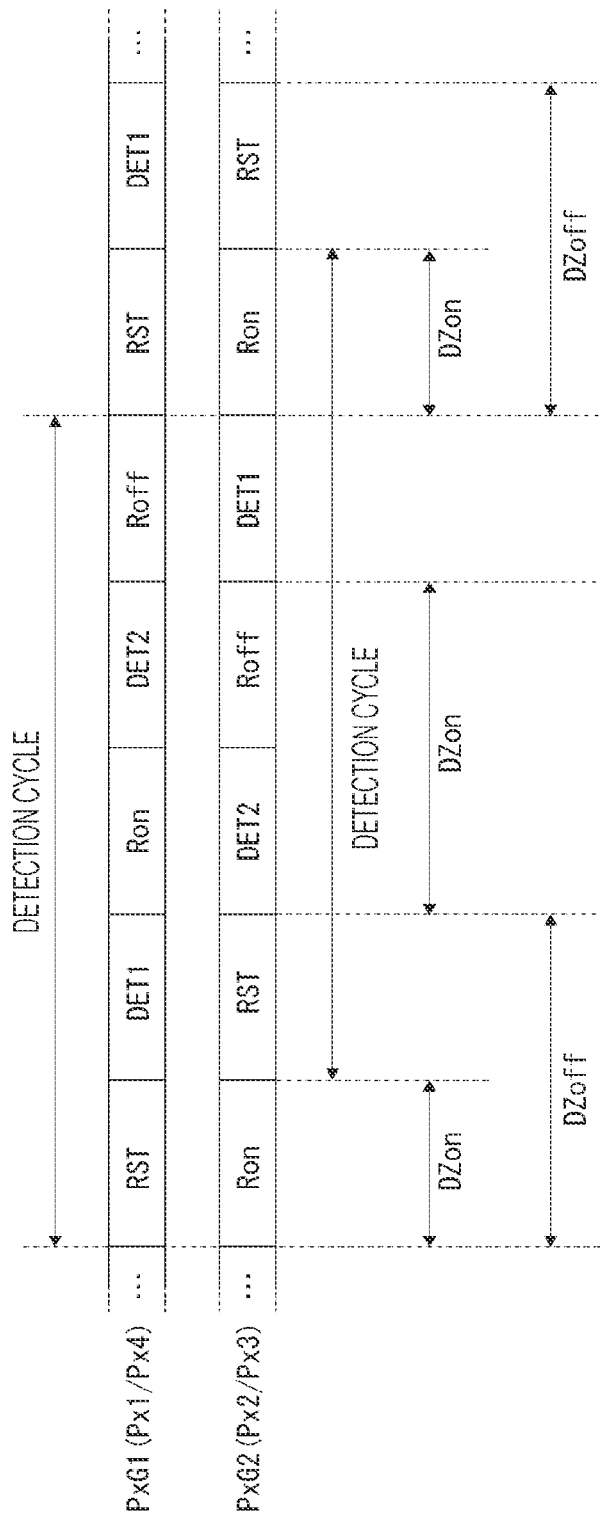
FIG. 18 is a diagram illustrating the respective detection cycles of the pixel groups according to a second embodiment.

FIG. 18 is a diagram illustrating the respective detection cycles of the pixel groups PxG. In the second embodiment, as in the first embodiment, a different detection cycle is set for each of the first pixel group PxG1 and the second pixel group PxG2.

For example, the detection cycle of the first pixel group PxG1 is set in the order of the reset period RST, the on event detection period DET1, the on event read period Ron, the off event detection period DET2, and the off event read period Roff. Furthermore, the detection cycle of the second pixel group PxG2 is set in the order of the reset period RST, the off event detection period DET2, the off event read period Roff, the on event detection period DET1, and the on event read period Ron.

Figure 19:
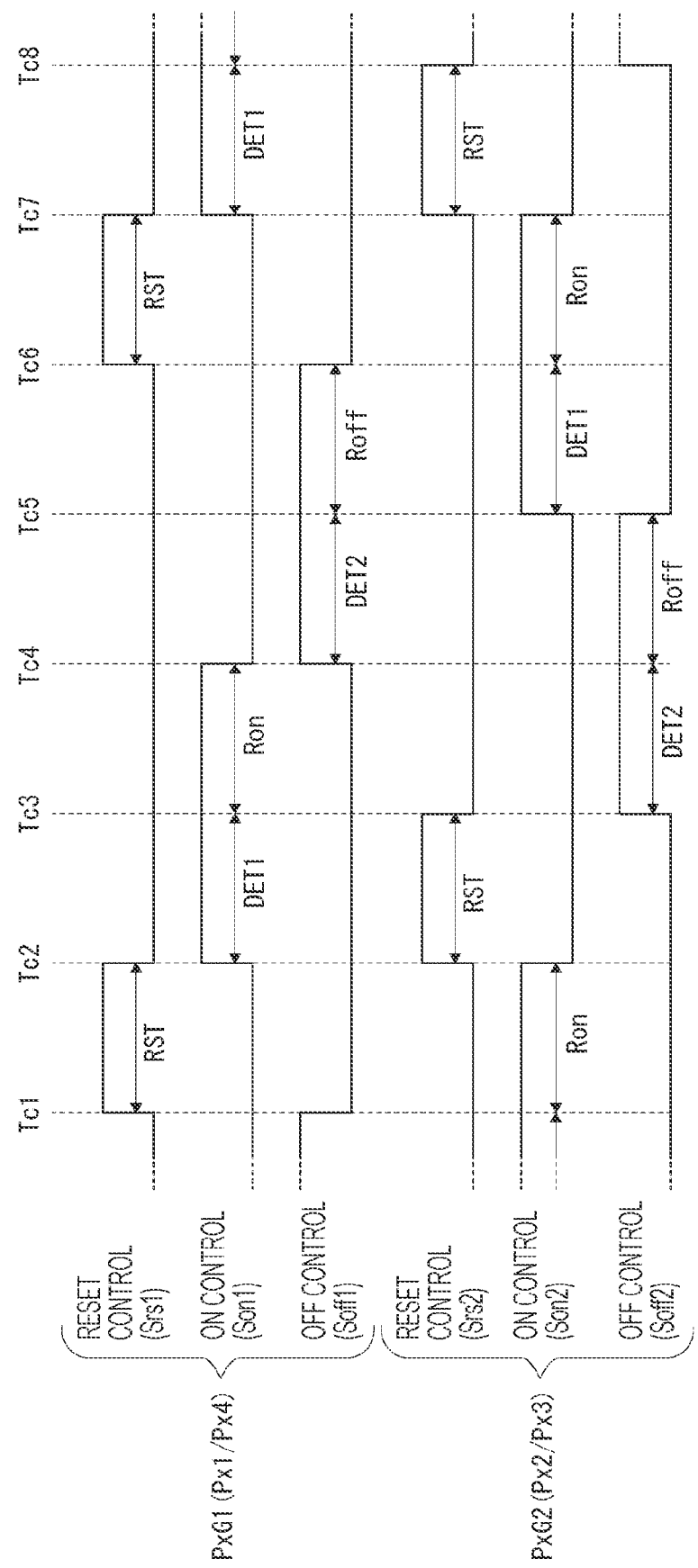
FIG. 19 is a timing chart of operation control in the periods according to the second embodiment.

FIG. 19 is a timing chart of operation control on each pixel group PxG by the control unit 40. The operation control on the first pixel group PxG1 by the control unit 40 at each time point Tc in FIG. 19 is similar to that in the first embodiment, and thus description thereof is omitted here.

The operation control on the second pixel group PxG2 by the control unit 40 will be described. The detection cycle of the second pixel group PxG2 is phase shifted by one period from the detection cycle of the first pixel group PxG1. Thus, description will be given here from a time point Tc2 that is the start of the detection cycle of the operation control on the second pixel group PxG2.

During a period from the time point Tc2 to a time point Tc3, the control unit 40 sets the reset control signal Srs2 to the H level to reset the detection operation of the event detection circuits 300 in the pixels Px2 and Px3 of the second pixel group PxG2. At the time point Tb2, the control unit 40 sets the reset control signal Srs2 to the L level to end the reset period RST.

Subsequently, during a period from the time point Tc3 to a time point Tc4, the control unit 40 sets the OFF control signal Soff2 to the H level so that the off event signal detection is performed in the pixels Px2 and Px3 of the second pixel group PxG2. Detected off event signals are recorded in the recording unit 30.

Thereafter, during a period from the time point Tc4 to a time point Tc5, as indicated as the off event read period Roff, the control unit 40 executes reading of the off event signals on the pixels Px2 and Px3 of the second pixel group PxG2 recorded in the recording unit 30. At the time point Tb4, the control unit 40 sets the OFF control signal Soff2 to the L level.

During a period from the time point Tc5 to a time point Tc6, the control unit 40 sets the ON control signal Son2 to the H level, so that the on event signal detection is performed in the pixels Px2 and Px3 of the second pixel group PxG2. Detected on event signals are recorded in the recording unit 30.

Thereafter, during a period from the time point Tc6 to a time point Tc7, as indicated as the on event read period Ron, the control unit 40 executes reading of the on event signals on the pixels Px2 and Px3 of the second pixel group PxG2 recorded in the recording unit 30. At the time point Tb6, the control unit 40 sets the ON control signal Son2 to the L level.

In the pixels Px2 and Px3 of the second pixel group PxG2, with the time point Tc2 to the time point Tc7 as one cycle of a detection period (detection cycle), similar operation is performed at and after the time point Tc7.

According to the above second embodiment, when the control unit 40 controls the detection cycles, during the on event read period Ron of the first pixel group PxG1, the second pixel group PxG2 is in the off event detection period DET2, and during the off event read period Roff of the first pixel group PxG1, the second pixel group PxG2 is in the on event detection period DET1. Furthermore, when the control unit 40 controls the detection cycles, the first pixel group PxG1 is in the on event detection period DET1 while the second pixel group PxG2 is in the reset period RST (see FIG. 18).

Thus, in the second embodiment, the detection cycles are set such that periods as the dead zones DZon and DZoff (the event read periods Ron and Roff and the reset period RST) in which detection of each event signal is not performed in one pixel group PxG are covered by the event detection periods DET of the other pixel group PxG. This can shorten the periods of the dead zone DZon of the on event signal detection and the dead zone DZoff of the off event signal detection in the solid-state imaging device 20.

Note that the second embodiment has described the example in which the pixels Px1 and Px4 are set as the first pixel group PxG1 and the pixels Px2 and Px3 as the second pixel group PxG2 as illustrated in FIG. 14. However, as described in the first embodiment, various combinations as illustrated in FIGS. 16 and 17, for example, can be considered for the pixels Px of each pixel group PxG.

8. Third Embodiment

A third embodiment will be described with reference to FIGS. 20 to 22. In the third embodiment, the pixels Px arranged in the pixel array 220 as illustrated in FIG. 10 are classified into a first pixel group PxG1 including all the pixels Px1, a second pixel group PxG2 including all the pixels Px2, a third pixel group PxG3 including all the pixels Px3, and a fourth pixel group PxG4 including all the pixels Px4.

Figure 20:
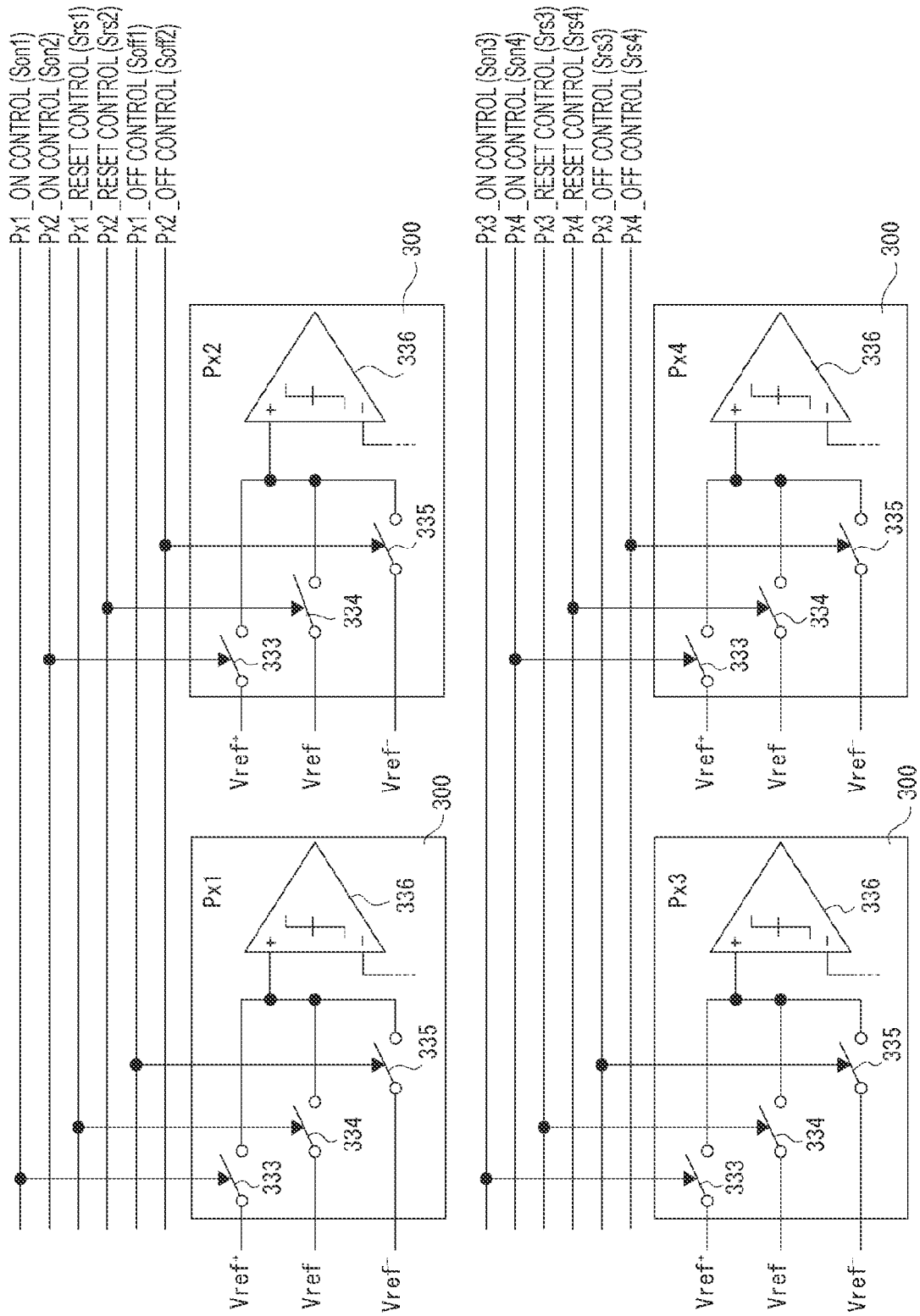
FIG. 20 is a diagram illustrating an outline of operation control on the pixels according to a third embodiment.

As illustrated in FIG. 20, the control unit 40 executes operation control based on operation control signals (an ON control signal Son1, a reset control signal Srs1, and an OFF control signal Soff1) for all the pixels Px1 included in the first pixel group PxG1. Furthermore, the control unit 40 executes operation control based on operation control signals (an ON control signal Son2, a reset control signal Srs2, and an OFF control signal Soff2) for all the pixels Px2 included in the second pixel group PxG2.

Likewise, the control unit 40 executes operation control based on operation control signals (an ON control signal Son3, a reset control signal Srs3, and an OFF control signal Soff3) on the event detection circuits 300 for all the pixels Px3 included in the third pixel group PxG3, and executes operation control based on operation control signals (an ON control signal Son4, a reset control signal Srs4, and an OFF control signal Soff4) for all the pixels Px4 included in the fourth pixel group PxG4.

This allows the control unit 40 to control the operation of the first pixel group PxG1, the second pixel group PxG2, the third pixel group PxG3, and the fourth pixel group PxG4 with different timing.

Figure 21:
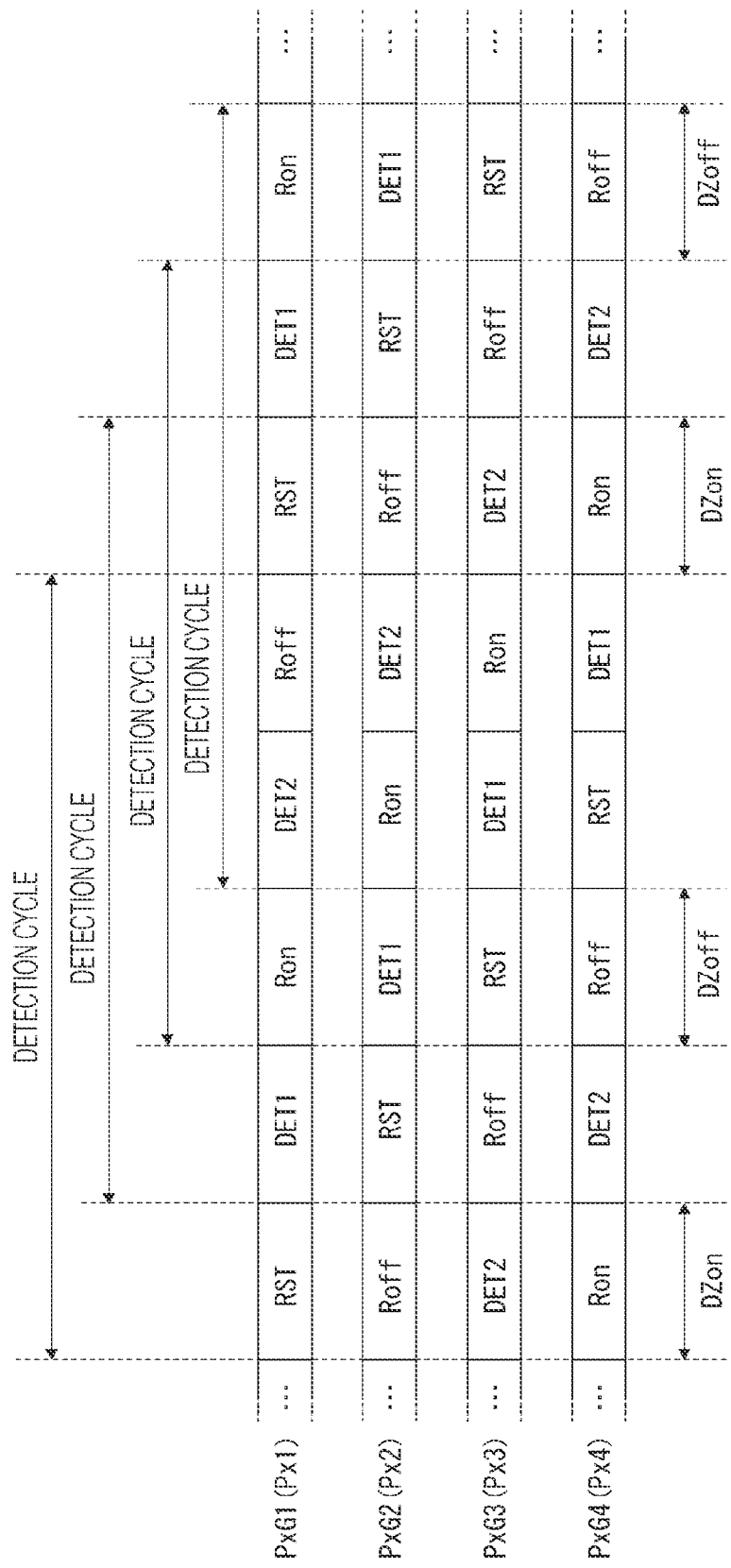
FIG. 21 is a diagram illustrating the respective detection cycles of pixel groups according to the third embodiment.

FIG. 21 is a diagram illustrating the detection cycle of each pixel group PxG of the first pixel group PxG1 to the fourth pixel group PxG4. For example, the detection cycle of each pixel group PxG is in the order of the reset period RST, the on event detection period DET1, the on event read period Ron, the off event detection period DET2, and the off event read period Roff.

In the third embodiment, each of the pixel groups PxG having the same detection cycle is controlled by the control unit 40 with different timing. Here, the detection cycle of the second pixel group PxG2 is started with its phase shifted by one period from that of the detection cycle of the first pixel group PxG1, the detection cycle of the third pixel group PxG3 is started with the phase of the detection cycle shifted by one period from that of the second pixel group PxG2, and the detection cycle of the fourth pixel group PxG4 is started with the phase of the detection cycle shifted by one period from that of the third pixel group PxG3.

Figure 22:
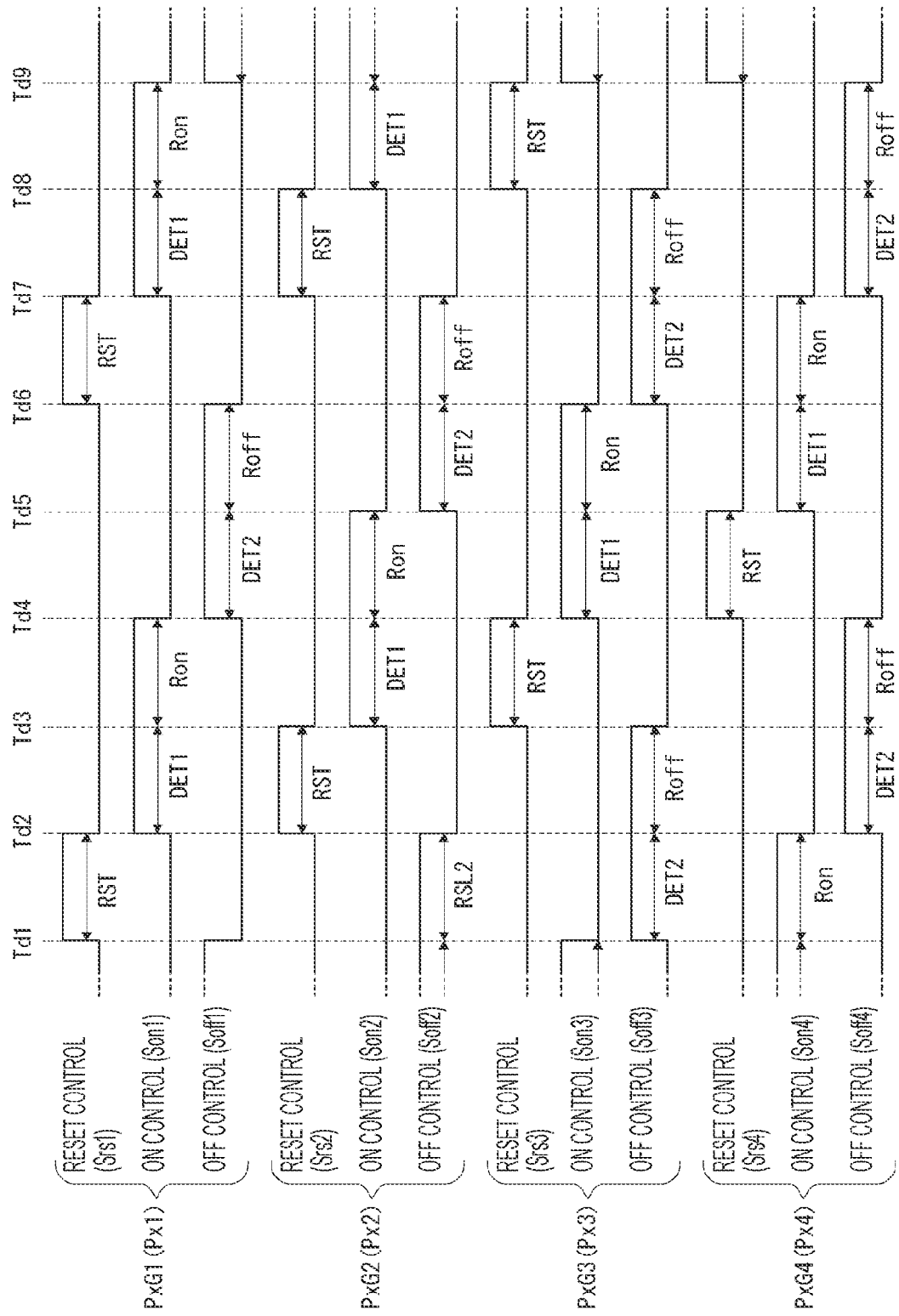
FIG. 22 is a timing chart of the operation control in the periods according to the third embodiment.

FIG. 22 is a timing chart of the operation control on each pixel group PxG by the control unit 40. First, the operation control on the first pixel group PxG1 by the control unit 40 will be described.

During a period from a time point Td1 to a time point Td2, the control unit 40 sets the reset control signal Srs1 to an H level to reset the detection operation of the event detection circuits 300 in all the pixels Px1 of the first pixel group PxG1. At the time point Td2, the control unit 40 sets the reset control signal Srs1 to an L level to end the reset period RST.

During a period from the time point Td2 to a time point Tb3, the control unit 40 sets the ON control signal Son1 to an H level, so that the on event signal detection is performed in the pixels Px1 of the first pixel group PxG1. Detected on event signals are recorded in the recording unit 30.

Thereafter, during a period from the time point Td3 to a time point Td4, as indicated as the on event read period Ron, the control unit 40 executes reading of the on event signals on the pixels Px1 of the first pixel group PxG1 recorded in the recording unit 30. At the time point Td4, the control unit 40 sets the ON control signal Son1 to an L level.

Subsequently, during a period from the time point Td4 to a time point Td5, the control unit 40 sets the OFF control signal Soff1 to an H level, so that the off event signal detection is performed in the pixels Px1 of the first pixel group PxG1. Detected off event signals are recorded in the recording unit 30.

Thereafter, during a period from the time point Td5 to a time point Td6, as indicated as the off event read period Roff, the control unit 40 executes reading of the off event signals on the pixels Px1 of the first pixel group PxG1 recorded in the recording unit 30. At the time point Td6, the control unit 40 sets the OFF control signal Soff1 to an L level.

With the time point Td1 to the time point Td6 above as one cycle of a detection period (detection cycle), similar operation is performed at and after the time point Td6.

In the operation control on the pixels Px2 of the second pixel group PxG2 by the control unit 40, since the phase of the detection cycle is shifted by one period from that of the first pixel group PxG1, the detection cycle of the second pixel group PxG2 is started from the time point Td2.

At this time, by the operation control based on the operation control signals (Son2, Srs2, and Soff2) by the control unit 40, the detection operation of the event detection circuits 300 is reset during the period from the time point Td2 to the time point Td3, the on event signal detection is performed during the period from the time point Td3 to the time point Td4, reading of on event signals is performed during the period from the time point Td4 to the time point Tb5, the off event signal detection is performed during the period from the time point Td5 to the time point Td6, and reading of off event signals is performed during the period from the time point Td6 to the time point Td7.

In the operation control on the pixels Px3 of the third pixel group PxG3 by the control unit 40, since the phase of the detection cycle is shifted by one period from that of the second pixel group PxG2, the detection cycle of the third pixel group PxG3 is started from the time point Td3.

At this time, by the operation control based on the operation control signals (Son3, Srs3, and Soff3) by the control unit 40, the detection operation of the event detection circuits 300 is reset during the period from the time point Td3 to the time point Td4, the on event signal detection is performed during the period from the time point Td4 to the time point Td5, reading of on event signals is performed during the period from the time point Td5 to the time point Td6, the off event signal detection is performed during the period from the time point Td6 to the time point Td7, and reading of off event signals is performed during the period from the time point Td7 to the time point Td8.

In the operation control on the pixels Px4 of the fourth pixel group PxG4 by the control unit 40, since the phase of the detection cycle is shifted by one period from that of the third pixel group PxG3, the detection cycle of the fourth pixel group PxG4 is started from the time point Tb4.

At this time, by the operation control based on the operation control signals (Son4, Srs4, and Soff4) by the control unit 40, the detection operation of the event detection circuits 300 is reset during the period from the time point Td4 to the time point Td5, the on event signal detection is performed during the period from the time point Td5 to the time point Td6, reading of on event signals is performed during the period from the time point Td6 to the time point Td7, the off event signal detection is performed during the period from the time point Td7 to the time point Td8, and reading of off event signals is performed during the period from the time point Td8 to the time point Td9.

According to the third embodiment, by setting the respective detection cycles of the pixel groups PxG different from each other, the dead zones DZon and DZoff in which the event signal detection cannot be performed in a certain pixel group PxG can be compensated for by performing the event signal detection in the other pixel groups PxG arranged in the vicinity. This can significantly shorten periods set as the dead zone DZon of the on event signal detection and the dead zone DZoff of the off event signal detection in the entire solid-state imaging device 20.

For example, in the on event read period Ron of the detection cycle of the first pixel group PxG1, the second pixel group PxG2 is in the on event detection period DET1, in the off event detection period DET2, the third pixel group PxG3 is, and in the off event read period Roff, the fourth pixel group PxG4 is. That is, as compared with the case where the operation control is performed on all the pixels Px with the same timing as illustrated in the comparative example, the dead zone DZon of the on event signal detection can be shortened by three periods, the on event read period Ron, the off event detection period DET2, and the off event read period Roff. The same applies to the dead zone DZoff of the off event signal detection.

Furthermore, for example, during the period from the timing Td2 to the timing Td3, the first pixel group PxG1 is in the on event detection period DET1, and the fourth pixel group PxG4 is in the off event detection period DET2. Likewise, for the timing Td4 to the timing Td5 and the timing Td5 to the timing Td6, when a certain pixel group PxG is in the on event detection period DET1, another pixel group PxG is in the off event detection period DET2.

Thus, according to the third embodiment, by shifting the detection cycle of each pixel group PxG, the on event signal detection and the off event signal detection can be executed in parallel by the operation control of the control unit 40 on each pixel group PxG.

Note that the third embodiment has described the example in which for the pixel groups PxG for each of which the same detection cycle is set, the respective detection cycles are shifted by one period from each other. However, various other examples can be considered for a period by which the detection cycles are shifted.

Figure 23:
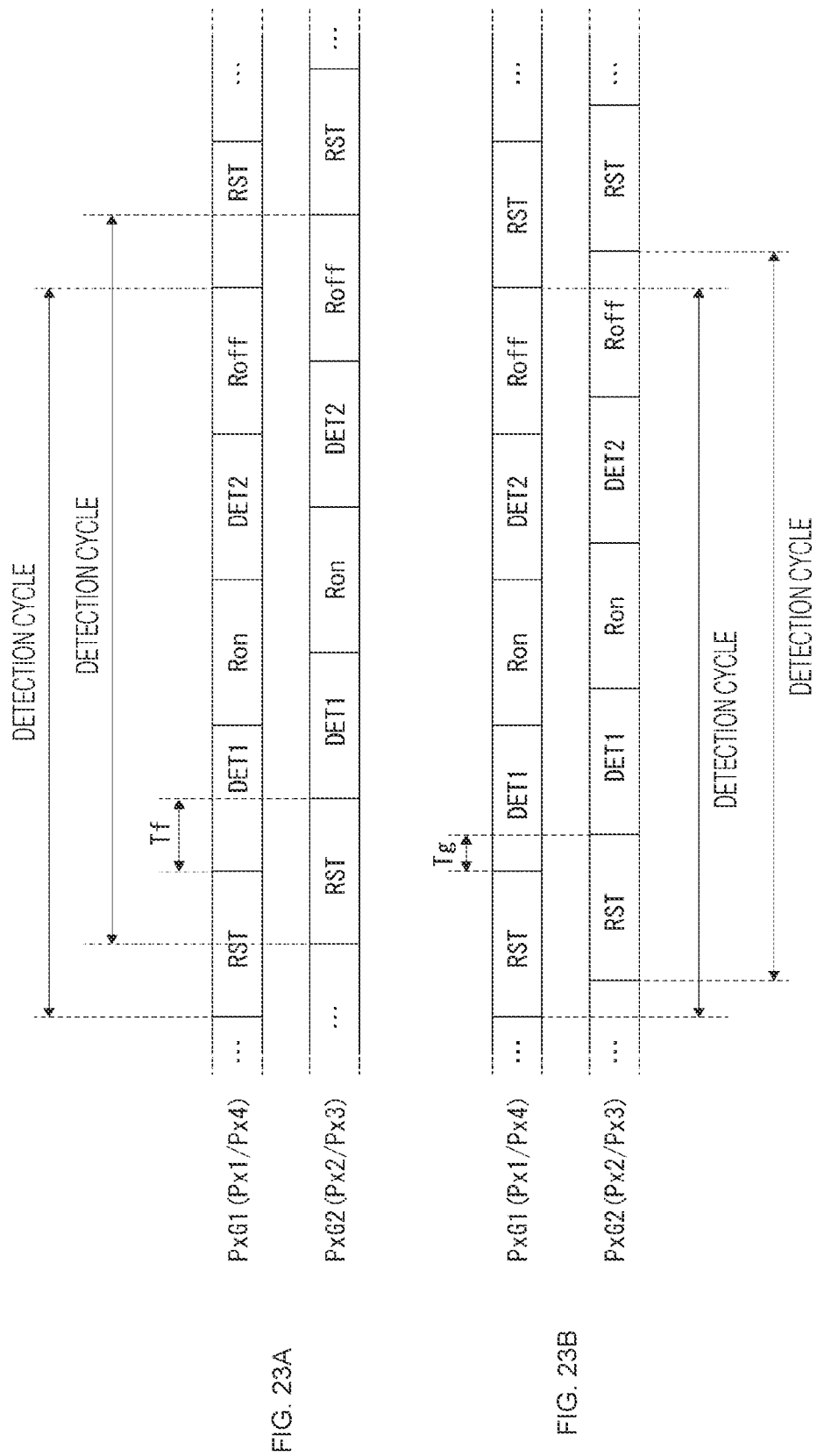
FIGS. 23A and 23B are modification of the timings of the operation control in the periods according to the third embodiment.

For example, as illustrated in FIG. 23A, the detection cycles of the first pixel group PxG1 and the second pixel group PxG2 may each be shifted by a period Tf that is one-half of the period set in the embodiment, or as illustrated in FIG. 23B, the detection periods may each be shifted by a period Tg that is one-quarter of the period set in the embodiment.

That is, by shifting the detection cycles, periods during which the event detection is performed in one of the adjacent pixels Px can be extended, so that dead zones in the event detection can be shortened.

9. Fourth Embodiment

A fourth embodiment will be described below with reference to FIGS. 24 and 25.

In the fourth embodiment, a plurality of quantizers 330 is provided in the event detection circuit 300 corresponding to each pixel Px.

Figure 24:
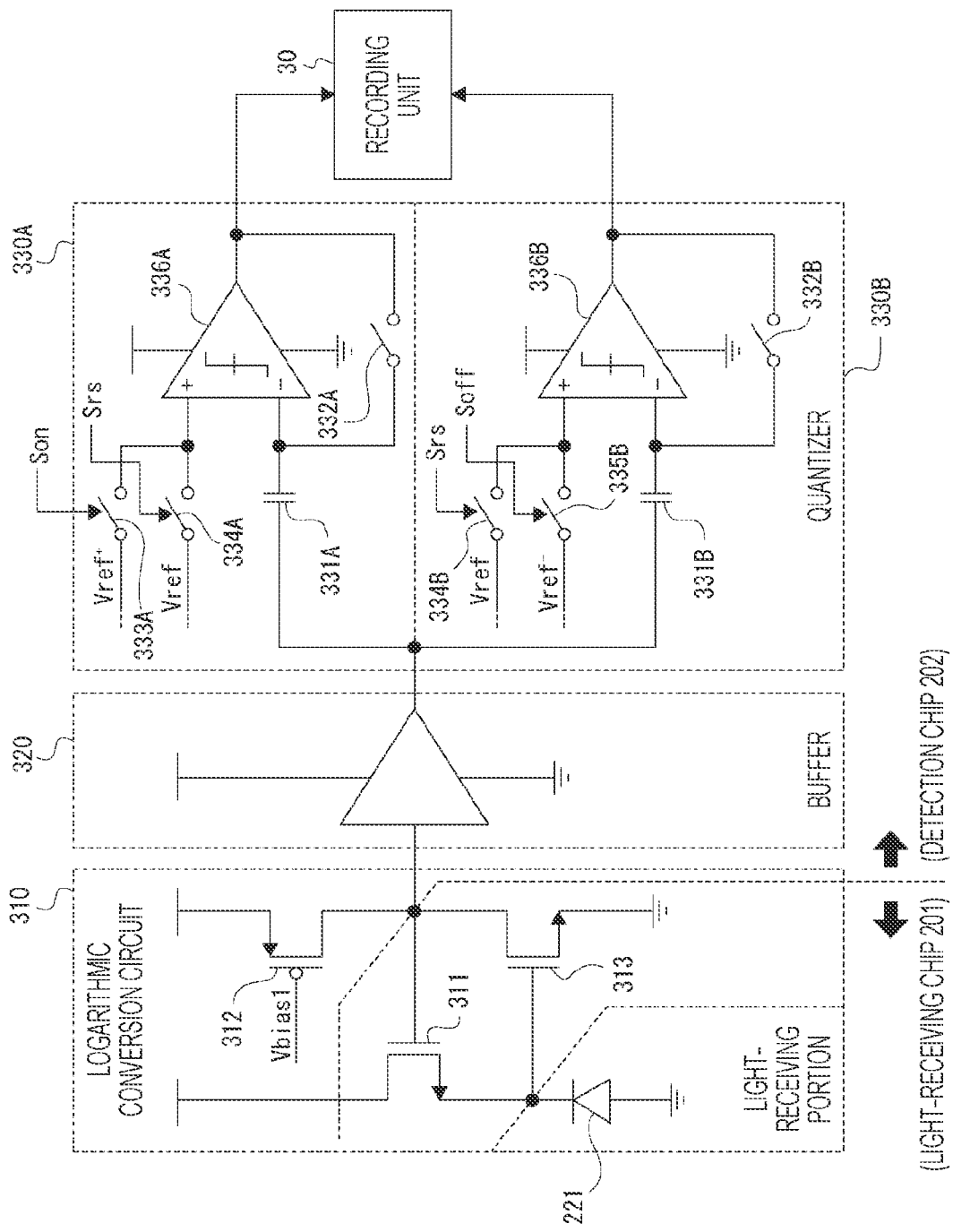
FIG. 24 is a circuit diagram illustrating the configuration of a detection circuit according to a fourth embodiment.

FIG. 24 is a circuit diagram illustrating a modification of the configuration of each event detection circuit 300 according to the fourth embodiment. Each event detection circuit 300 includes the logarithmic conversion circuit 310, the buffer 320, a first quantizer 330A, and a second quantizer 330B.

The first quantizer 330A includes a capacitor 331A, switching elements 332A, 333A, and 334A, and a comparator 336A.

One end of the capacitor 331A is connected to the output terminal of the buffer 320, and the other end thereof is connected to the inverting input terminal of the comparator 336A. Thus, a voltage applied to the comparator 336A changes according to a change in a logarithmically converted voltage signal output to the one end of the capacitor 331A.

The switching element 332A turns on and off between the output terminal and the inverting input terminal of the comparator 336A according to an operation control signal from the control unit 40.

The switching elements 333A and 334A make two corresponding paths connected to the non-inverting input terminal of the comparator 336A electrically continuous according to operation control signals (Son and Srs) from the control unit 40.

The control unit 40 performs operation control on the event detection circuit 300 in a time-division manner, using an ON control signal Son and a reset control signal Srs.

The control unit 40 brings the switching element 333A into conduction by the ON control signal Son. Consequently, the comparison reference voltage Vref+ on the positive side is input to the non-inverting input terminal of the comparator 336A. The comparator 336A performs on event signal detection by comparing the amount of change in the voltage signal input with the comparison reference voltage Vref+ to output an on event signal when the voltage signal is above the comparison reference voltage Vref+. The on event signal output from the comparator 336A is recorded in the recording unit 30. A reset operation is performed by bringing the switching element 332A and the switching element 334A into conduction.

On the other hand, the second quantizer 330B includes a capacitor 331B, switching elements 332B, 334B, and 335B, and a comparator 336B.

One end of the capacitor 331B is connected to the output terminal of the buffer 320, and the other end thereof is connected to the inverting input terminal of the comparator 336B. Thus, a voltage applied to the comparator 336B changes according to a change in a logarithmically converted voltage signal output to the one end of the capacitor 331B.

The switching element 332B turns on and off between the output terminal and the inverting input terminal of the comparator 336B according to an operation control signal from the control unit 40.

The switching elements 334B and 335B make two corresponding paths connected to the non-inverting input terminal of the comparator 336B electrically continuous according to operation control signals (Srs and Soff) from the control unit 40.

The control unit 40 performs operation control on the event detection circuit 300 in a time division manner, using an OFF control signal Soff and the reset control signal Srs.

The control unit 40 brings the switching element 335B into conduction by the OFF control signal Soff. Consequently, the comparison reference voltage Vref− on the negative side is input to the non-inverting input terminal of the comparator 336B. The comparator 336B performs off event signal detection by comparing the amount of change in the voltage signal input with the comparison reference voltage Vref− to output an off event signal when the voltage signal is below the comparison reference voltage Vref−. The off event signal output from the comparator 336B is recorded in the recording unit 30. A reset operation is performed by bringing the switching element 334B and the switching element 335B into conduction.

According to the fourth embodiment, the control unit 40 can bring the switching element 335B into conduction at the timing of bringing the switching element 334A into conduction, using the operation control signals. Consequently, the event detection circuit 300 corresponding to one pixel Px can perform both the on event signal detection and the off event signal detection at the same timing.

Figure 25:
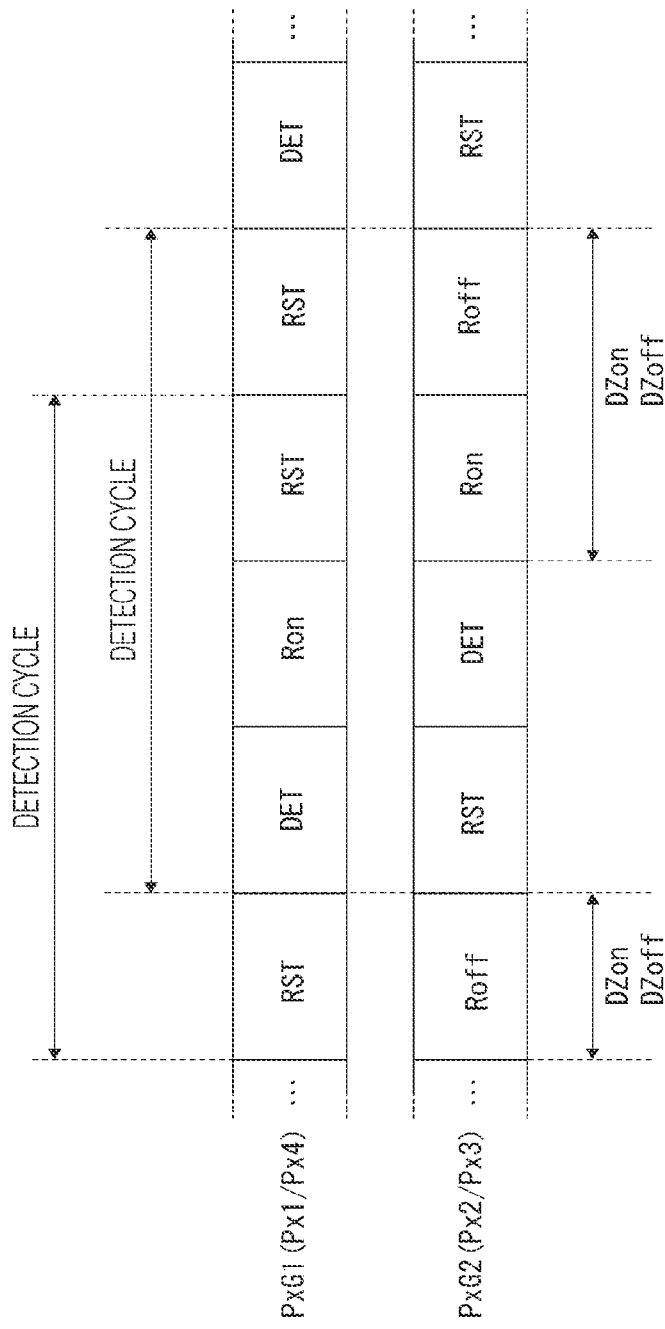
FIG. 25 is a diagram illustrating the respective detection cycles of pixel groups according to the fourth embodiment.

FIG. 25 is a diagram illustrating the detection cycle of each pixel group PxG according to the fourth embodiment. In an example of the fourth embodiment, a case will be described in which a different detection cycle is set for each pixel group PxG, and then the phase of the detection cycle is shifted for each pixel group PxG.

In the fourth embodiment, as in the first embodiment, the pixels Px arranged in the pixel array 220 are classified into the first pixel group PxG1 including the pixels Px1 and the pixels Px4 hatched, and the second pixel group PxG2 including the pixels Px2 and the pixels Px3 not hatched (see FIG. 12).

The detection cycle of each pixel group PxG is set in the order of the reset period RST, the event detection period DET, the on event read period Ron, and the off event read period Roff.

In the operation control on the second pixel group PxG2 by the control unit 40, the phase of the detection cycle is shifted from that of the first pixel group PxG1 by one period, so that the dead zones DZon and DZoff in which the event signal detection cannot be performed in a certain pixel group PxG can be compensated for by performing the event signal detection in the other pixel group PxG arranged in the vicinity.

This can shorten the dead zones DZon and DZoff in which the event signal detection is not performed.

Furthermore, during the event detection period DET, the on event signal detection and the off event signal detection can be executed in parallel by one pixel Px according to the operation control by the control unit 40. Consequently, a period from an event detection period to the next event detection period is shortened, so that the periods of the dead zones DZon and DZoff in which the event signal detection is not performed can be shortened.

10. Summary

The imaging device 1 according to the embodiment includes the solid-state imaging device 20 including the plurality of pixels Px each including the light-receiving portion 221 that photoelectrically converts incident light to generate an electrical signal and the event detection circuit 300 that executes event signal detection by comparing the amount of change in the electrical signal generated by the light-receiving portion 221 with a predetermined threshold value to obtain a detection result, and the control unit 40 that performs control so that each pixel groups PxG has different timing for the event detection period DET to cause the event detection circuit 300 to execute the event signal detection (see FIGS. 15, 16, etc.).

Thus, the event signal detection is performed with different timing for each pixel group PxG of the solid-state imaging device 20, so that even when the event signal detection is not performed in a certain pixel group PxG, the event signal detection is performed in another pixel group PxG. Consequently, the periods of dead zones in which the event signal detection is not performed by all the pixel groups PxG can be shortened, and the accuracy of the event signal detection of the imaging device 1 on the time axis can be improved.

Note that at this time, it is desirable that the pixels of the first pixel group PxG1 (e.g., the pixels Px1 and Px4) and the pixels of the second pixel group PxG2 (e.g., the pixels Px2 and Px3) that is different from the first pixel group PxG1 in the timing of the operation control by the control unit 40 are adjacent to each other (see FIGS. 12, 16, and 17).

This can prevent creation of imbalances in the accuracy of the event signal detection depending on positions in the pixel array 220 of the solid-state imaging device 20. Thus, the accuracy of the event signal detection of the imaging device 1 can be further improved. Note that the pixels Px of the first pixel group PxG1 and the pixels Px of the second pixel group PxG2 may not be adjacent to each other if they are in a positional relationship to compensate for the dead zones of the pixels Px, and only need to be arranged in the vicinity of each other.

In the imaging device 1 according to the embodiment, each event detection circuit 300 executes, as the event signal detection, the on event signal detection by comparing the amount of change in the electrical signal generated by the light-receiving portion 221 with a first threshold voltage Vref+ to obtain a detection result, and the off event signal detection by comparing the amount of change in the electrical signal generated by the light-receiving portion 221 with a second threshold voltage Vref− to obtain a detection result, and the control unit 40 performs the operation control on the event detection circuit 300 of each pixel Px in the detection cycle including the on event detection period DET1 to cause the on event signal detection to be executed, the off event detection period DET2 to cause the off event signal detection to be executed, the reset period RST, and the event read periods Ron and Roff (see FIGS. 14, 15, etc.).

The control unit 40 performs control such that each pixel group PxG has different timing for the event detection period DET such as the on event detection period DET1 and the off event detection period DET2, so that even in each period of the reset period RST and the event read periods Ron and Roff during which a certain pixel group PxG does not execute the event signal detection, another pixel group PxG executes the event signal detection. Consequently, the periods of the dead zones in which the event signal detection is not performed by all the pixel groups PxG can be shortened, and the accuracy of the event signal detection of the imaging device 1 can be improved.

Note that the present embodiment has described each period of the event detection period DET, the reset period RST, and the event read periods Ron and Roff as having the same length, but the respective lengths of the periods may be set to different lengths.

In the imaging device 1 according to the third embodiment, the control unit 40 performs control so that each pixel group PxG has different timing for the on event detection period DET1 (see FIGS. 21, 22, etc.). By performing control so that each pixel group PxG has different timing for the on event detection period DET1, even in each period of the off event detection period DET2, the reset period RST, and the event read periods Ron and Roff during which a certain pixel group PxG does not execute the on event signal detection, another pixel group PxG executes the on event signal detection.

Consequently, the period of the dead zone in which the on event signal detection is not performed by all the pixel groups PxG can be shortened, and the accuracy of the on event signal detection of the imaging device 1 can be improved.

In the imaging device 1 according to the third embodiment, the control unit 40 performs control so that each pixel group PxG has different timing for the off event detection period DET2 (see FIGS. 21, 22, etc.). By performing control so that each pixel group PxG has different timing for the off event detection period DET2, even in each period of the on event detection period DET1, the reset period RST, and the event read periods Ron and Roff during which a certain pixel group PxG does not execute the off event signal detection, another pixel groups PxG executes the off event signal detection.

Consequently, the period of the dead zone in which the off event signal detection is not performed by all the pixel groups PxG can be shortened, and the accuracy of the off event signal detection of the imaging device 1 can be improved.

In the imaging device 1 according to the first embodiment, the control unit 40 performs control so that when the event detection circuits 300 in the pixels of the first pixel group PxG1 (e.g., Px1 and Px4) are in the on event detection period DET1, the event detection circuits 300 in the pixels of the second pixel group PxG2 (e.g., Px2 and Px3) are in the off event detection period DET2 (see FIGS. 15, 16, etc.).

Consequently, in the solid-state imaging device 20, the on event signal detection and the off event signal detection are performed in parallel in a certain period. This can improve the accuracy of the event signal detection in that period.

In the imaging device 1 according to the second embodiment, the control unit 40 performs control so that when the event detection circuits 300 in the pixels of the first pixel group PxG1 (e.g., the pixels Px1 and Px4) are in the on event detection period DET1 or the off event detection period DET2, the event detection circuits 300 in the pixels of the second pixel group PxG2 (e.g., Px2 and Px3) are in the event read period Ron or Roff (see FIGS. 18, 19, etc.).

Even when the second pixel group PxG2 is in the event read period Ron or Roff that is a dead zone of the event signal detection, the first pixel group PxG1 performs the on or off event signal detection. Thus, the solid-state imaging device 20 as a whole performs at least the on or off event signal detection. Consequently, the periods of the dead zones of the event signal detection can be shortened, so that the accuracy of the event signal detection of the imaging device 1 can be improved.

In the imaging device 1 according to the second embodiment, the control unit 40 performs control so that when the event detection circuits 300 in the pixels of the first pixel group PxG1 (e.g., the pixels Px1 and Px4) are in the on event detection period DET1 or the off event detection period DET2, the event detection circuits 300 in the pixels of the second pixel group PxG2 (e.g., the pixels Px2 and Px3) are in the reset period RST (see FIGS. 18, 19, etc.).

Even when the second pixel group PxG2 is in the reset period RST that is a dead zone of the event signal detection, the first pixel group PxG1 performs the on or off event signal detection. Thus, the solid-state imaging device 20 as a whole performs at least the on or off event signal detection. Consequently, the periods of the dead zones of the event signal detection can be shortened, so that the accuracy of the event signal detection of the imaging device 1 can be improved.

In the imaging device 1 according to the third embodiment, the control unit 40 performs control so that, for example, a part of the on event detection period DET1 in the event detection circuits 300 of the pixels Px1 of the first pixel group PxG1 coincides with a part of the on event detection period DET1 in the event detection circuits 300 of the pixels Px2 of the second pixel group PxG2 (see FIGS. 21, 22, 23A, 23B and 23C, etc.).

Consequently, for example, with reference to the detection cycle of the first pixel group PxG1, the on event detection period DET1 in that detection cycle is extended. Thus, the period of the dead zone in which the on event signal detection is not performed in that detection cycle can be shortened, and the accuracy of the on event signal detection of the imaging device 1 can be improved.

In the imaging device 1 according to the third embodiment, the control unit 40 performs control so that, for example, a part of the off event detection period DET2 in the event detection circuits 300 of the pixels Px1 of the first pixel group PxG1 coincides with a part of the off event detection period DET2 in the event detection circuits 300 of the pixels Px2 of the second pixel group PxG2 (see FIGS. 23A and 23B, etc.).

Consequently, with reference to the detection cycle of the first pixel group PxG1, the off event detection period DET2 for that detection cycle is extended. Thus, the period of the dead zone in which the off event signal detection is not performed in that detection cycle can be shortened, and the accuracy of the off event signal detection of the imaging device 1 can be improved.

In the imaging device 1 according to the embodiment, the solid-state imaging device 20 has the laminated structure including the light-receiving chip 201 provided with the light-receiving portions 221 and the detection chip 202 provided with the event detection circuits 300 (see FIGS. 2, 8, etc.). Thus, by placing the light-receiving chip 201 and the detection chip 202 in layers, the efficiency of circuit arrangement is improved.

In the asynchronous solid-state imaging device 20, a pixel circuit is provided at each pixel Px, which includes the light-receiving portion 221 and the event detection circuit 300, and which is more complicated than in the case of a synchronous one that performs imaging in synchronization with a vertical synchronization signal. For example, in the solid-state imaging device 20, the light-receiving portions 221 and the event detection circuits 300 are dispersedly placed on the light-receiving chip 201 and the detection chip 202 stuck in layers, so that the footprint can be reduced.

Furthermore, as illustrated in FIG. 8, for example, by placing the N-type transistors 311 and 313 on the light-receiving chip 201, the circuit scale of the detection chip 202 can be reduced by the amount of those transistors. In addition, only N-type transistors are on the light-receiving chip 201, so that the number of processes to form transistors can be reduced as compared with the case where N-type transistors and P-type transistors are mixed. This can reduce the manufacturing cost of the light-receiving chip 201.

The program according to the embodiment is a program that causes, for example, a CPU, a DSP, or the like, or a device including these to execute the following processing.

That is, the program according to the embodiment is a program that causes an imaging device to execute, for a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result, control so that different pixel groups have different timing for an event detection period to cause the detection circuit to execute the event signal detection. Such a program allows implementation in, for example, an apparatus such as a camera mounted on an industrial robot or a vehicle-mounted camera.

Such a program can be recorded in advance in an HDD as a recording medium built in an apparatus such as a computer device, ROM in a microcomputer including a CPU, or the like.

Alternatively, it may be stored (recorded) temporarily or permanently in a removable recording medium such as a flexible disk, a compact disc read-only memory (CD-ROM), a magnet optical (MO) disk, a digital versatile disc (DVD), a Blue-ray Disc (registered trademark), a magnetic disk, a semiconductor memory, or a memory card. Such a removable recording medium can be provided as so-called packaged software.

Furthermore, such a program may be installed on a personal computer or the like from a removable recording medium, or downloaded from a download site via a network such as a local-area network (LAN) or the Internet.

Note that the effects described in the present disclosure are merely examples and nonlimiting, and other effects may be included.

Furthermore, the description of the embodiments described in the present disclosure is merely an example, and the present technology is not limited to the above-described embodiments. Therefore, it goes without saying that in addition to the above-described embodiments, various changes can be made depending on design etc. without departing from the technical idea of the present technology.

The present technology can also have the following configurations.

(1)

An imaging device including:

a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result; and a control unit that performs control so that different pixel groups have different timing for an event detection period to cause the detection circuit to execute the event signal detection.

(2)

The imaging device according to (1) above, in which the detection circuit executes, as the event signal detection, on event signal detection by comparing the amount of change in the electrical signal generated by the light-receiving portion with a first threshold value to obtain a detection result, and off event signal detection by comparing the amount of change in the electrical signal generated by the light-receiving portion with a second threshold value to obtain a detection result, and the control unit performs operation control on the detection circuit of each pixel in a detection cycle including an on event detection period to cause the on event signal detection to be executed, an off event detection period to cause the off event signal detection to be executed, a reset period, and an event read period.

(3)

The imaging device according to (2) above, in which the control unit performs control so that each pixel group has different timing for the on event detection period.

(4)

The imaging device according to (2) above, in which the control unit performs control so that each pixel group has different timing for the off event detection period.

(5)

The imaging device according to any one of (2) to (4) above, in which the control unit performs control so that when the detection circuit in each pixel of a first pixel group is in the on event detection period, the detection circuit in each pixel of a second pixel group is in the off event detection period.

(6)

The imaging device according to any one of (2) to (5) above, in which the control unit performs control so that when the detection circuit in each pixel of a first pixel group is in the on event detection period or the off event detection period, the detection circuit in each pixel of a second pixel group is in the read period.

(7)

The imaging device according to any one of (2) to (6) above, in which the control unit performs control so that when the detection circuit in each pixel of a first pixel group is in the on event detection period or the off event detection period, the detection circuit in each pixel of a second pixel group is in the reset period.

(8)

The imaging device according to (3) above, in which the control unit performs control so that a part of the on event detection period in the detection circuit of each pixel of a first pixel group coincides with a part of the on event detection period in the detection circuit of each pixel of a second pixel group.

(9)

The imaging device according to (4) above, in which the control unit performs control so that a part of the off event detection period in the detection circuit of each pixel of a first pixel group coincides with a part of the off event detection period in the detection circuit of each pixel of a second pixel group.

(10)

The imaging device according to any one of (1) to (9) above, in which the pixels of a first pixel group and the pixels of a second pixel group are adjacent to each other.

(11)

The imaging device according to any one of (1) to (10) above, in which the solid-state imaging device has a laminated structure including a light-receiving chip provided with the light-receiving portions and a detection chip provided with the detection circuits.

(12)

An imaging control method including:

for a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result, executing, by an imaging device, control so that different pixel groups have different timing for an event detection period to cause the detection circuit to execute the event signal detection.

(13)

A program that causes an imaging device to execute, for a solid-state imaging device including a plurality of pixels each including a light-receiving portion that photoelectrically converts incident light to generate an electrical signal and a detection circuit that executes event signal detection by comparing the amount of change in the electrical signal generated by the light-receiving portion with a predetermined threshold value to obtain a detection result, control so that different pixel groups have different timing for an event detection period to cause the detection circuit to execute the event signal detection.

REFERENCE SIGNS LIST

1 Imaging device
20 Solid-state imaging device
30 Recording unit
40 Control unit
201 Light-receiving chip
202 Detection chip
221 Light-receiving portion
300 Detection circuit
Px Pixel
PxG Pixel group
RST Reset period
DET1 On event detection period
Ron On event read period
DET2 Off event detection period
Roff Off event read period

The invention claimed is:

1. An imaging device, comprising:
a solid-state imaging device including:
    a plurality of pixels each including a light-receiving portion that photoelectrically converts incident light to generate an electrical signal, and
    a detection circuit configured to:
        execute event signal detection by comparing an amount of change in the electrical signal generated by the light-receiving portion with a specific threshold value to obtain a detection result; and
        execute, as the event signal detection, on event signal detection by comparing the amount of change in the electrical signal generated by the light-receiving portion with a first threshold value to obtain the detection result, and off event signal detection by comparing the amount of change in the electrical signal generated by the light-receiving portion with a second threshold value to obtain the detection result; and
a control unit configured to execute control so that different pixel groups have different timing for an event detection period to cause the detection circuit to execute the event signal detection, wherein
    the control is executed on the detection circuit of each pixel in a detection cycle including an on event detection period to cause the on event signal detection to be executed, an off event detection period to cause the off event signal detection to be executed, a reset period, and an event read period, and
    the control is executed so that when the detection circuit in each pixel of a first pixel group is in the on event detection period, the detection circuit in each pixel of a second pixel group is in the off event detection period.

2. The imaging device according to claim 1, wherein
the control unit is further configured to execute control so that each pixel group has different timing for the on event detection period.

3. The imaging device according to claim 2, wherein
the control unit is further configured to execute control so that a part of the on event detection period in the detection circuit of each pixel of a first pixel group coincides with a part of the on event detection period in the detection circuit of each pixel of a second pixel group.

4. The imaging device according to claim 1, wherein the control unit is further configured to execute control so that each pixel group has different timing for the off event detection period.

5. The imaging device according to claim 4, wherein the control unit is further configured to execute control so that a part of the off event detection period in the detection circuit of each pixel of a first pixel group coincides with a part of the off event detection period in the detection circuit of each pixel of a second pixel group.

6. The imaging device according to claim 1, wherein the control unit is further configured to performs control so that when the detection circuit in each pixel of a first pixel group is in the on event detection period or the off event detection period, the detection circuit in each pixel of a second pixel group is in the read period.

7. The imaging device according to claim 1, wherein the control unit is further configured to execute control so that when the detection circuit in each pixel of a first pixel group is in the on event detection period or the off event detection period, the detection circuit in each pixel of a second pixel group is in the reset period.

8. The imaging device according to claim 1, wherein the pixels of a first pixel group and the pixels of a second pixel group are adjacent to each other.

9. The imaging device according to claim 1, wherein the solid-state imaging device has a laminated structure including a light-receiving chip provided with the light-receiving portion and a detection chip provided with the detection circuit.

10. An imaging control method, comprising:
for a solid-state imaging device including a plurality of pixels each including a light-receiving portion that photoelectrically converts incident light to generate an electrical signal and a detection circuit that executes event signal detection by comparing an amount of change in the electrical signal generated by the light-receiving portion with a specific threshold value to obtain a detection result, executing, by an imaging device, as the event signal detection, on event signal detection by comparing the amount of change in the electrical signal generated by the light-receiving portion with a first threshold value to obtain the detection result, and off event signal detection by comparing the amount of change in the electrical signal generated by the light-receiving portion with a second threshold value to obtain the detection result;

executing, by the imaging device, control so that different pixel groups have different timing for an event detection period to cause the detection circuit to execute the event signal detection;

executing, by the imaging device, control on the detection circuit of each pixel in a detection cycle including an on event detection period to cause the on event signal detection to be executed, an off event detection period to cause the off event signal detection to be executed, a reset period, and an event read period; and executing, by the imaging device, control so that when the detection circuit in each pixel of a first pixel group is in the on event detection period, the detection circuit in each pixel of a second pixel group is in the off event detection period.

11. A non-transitory computer-readable medium having stored thereon, computer-executable instructions which, when executed by a computer, cause the computer to execute operations, the operations comprising:
for a solid-state imaging device including a plurality of pixels each including a light-receiving portion that photoelectrically converts incident light to generate an electrical signal and a detection circuit that executes event signal detection by comparing an amount of change in the electrical signal generated by the light-receiving portion with a specific threshold value to obtain a detection result, executing, as the event signal detection, on event signal detection by comparing the amount of change in the electrical signal generated by the light-receiving portion with a first threshold value to obtain the detection result, and off event signal detection by comparing the amount of change in the electrical signal generated by the light-receiving portion with a second threshold value to obtain the detection result;

executing control so that different pixel groups have different timing for an event detection period to cause the detection circuit to execute the event signal detection;

executing control on the detection circuit of each pixel in a detection cycle including an on event detection period to cause the on event signal detection to be executed, an off event detection period to cause the off event signal detection to be executed, a reset period, and an event read period; and executing control so that when the detection circuit in each pixel of a first pixel group is in the on event detection period, the detection circuit in each pixel of a second pixel group is in the off event detection period.

* * * * *